United States Patent [19]

Reardon et al.

[11] Patent Number: 4,552,830

[45] Date of Patent: Nov. 12, 1985

[54] CARBONYLIC HALIDES AS ACTIVATORS FOR PHOTOTROPIC COMPOSITIONS

[75] Inventors: Edward J. Reardon, El Toro; Melvin A. Lipson, Fullerton, both of Calif.

[73] Assignee: Dynachem Corporation, Tustin, Calif.

[21] Appl. No.: 555,444

[22] Filed: Nov. 25, 1983

Related U.S. Application Data

[63] Continuation of Ser. No. 317,954, Nov. 3, 1981, abandoned, which is a continuation-in-part of Ser. No. 195,168, Oct. 8, 1980, abandoned, which is a continuation of Ser. No. 7,095, Nov. 23, 1979, abandoned, which is a continuation of Ser. No. 904,144, May 9, 1978, abandoned.

[51] Int. Cl.[4] .......................... G03C 1/68; G03C 1/52
[52] U.S. Cl. ...................................... 430/281; 430/340; 430/344; 430/286; 430/288; 430/292; 430/275; 430/343; 430/342; 430/338
[58] Field of Search ............... 430/281, 340, 344, 286, 430/288, 292, 275, 343, 342, 338

[56] References Cited

U.S. PATENT DOCUMENTS

| T889,019 | 8/1971 | Hamb . | |
|---|---|---|---|
| 3,140,947 | 7/1964 | Foris . | |
| 3,445,232 | 5/1969 | Shirey . | |
| 3,501,331 | 3/1970 | Kimura et al. | 428/498 |
| 3,514,310 | 5/1970 | Kimura et al. | 346/221 |
| 3,525,616 | 8/1970 | Hackman et al. . | |
| 3,527,639 | 9/1970 | Moraw . | |
| 3,637,390 | 1/1972 | Peterson . | |
| 3,767,408 | 10/1973 | Harrison et al. | 430/343 |
| 3,769,023 | 10/1973 | Lewis et al. | 430/282 |
| 3,929,831 | 12/1975 | Garner et al. | 548/407 |
| 4,007,195 | 2/1977 | Garner et al. | 346/222 |
| 4,017,313 | 4/1977 | Hartzler . | |
| 4,065,315 | 12/1977 | Yamazaki et al. . | |
| 4,097,288 | 6/1978 | Lawton . | |

FOREIGN PATENT DOCUMENTS

| 1146497 | 3/1969 | United Kingdom | 430/270 |
|---|---|---|---|
| 1269601 | 4/1972 | United Kingdom | 430/338 |
| 1339316 | 12/1973 | United Kingdom | 430/338 |

*Primary Examiner*—Won H. Louie
*Attorney, Agent, or Firm*—George F. Wheeler; Gerald K. White

[57] ABSTRACT

Compositions containing a polymerizable, curable or crosslinkable component, a photoinitiator, a colorformer capable of changing color upon contact with a suitable activator and a latent activator containing an organic halide will become insoluble and change color under the influence of actinic radiation. The organic halide is a carbonylic compound such as an aliphatic or cycloaliphatic ketone or an ester or amide of a dicarboxylic acid. The compositions are useful to make resists used in the electronics industry to manufacture printed circuits.

63 Claims, No Drawings

CARBONYLIC HALIDES AS ACTIVATORS FOR PHOTOTROPIC COMPOSITIONS

This application is a continuation of Application Ser. No. 317,954, filed on Nov. 3, 1981, and now abandoned, which continuation-in-part application of Application Ser. No. 195,168, filed Oct. 8, 1980, and now abandoned, which in turn is a continuation of Application Ser. No. 007,095, filed Nov. 23, 1979, and now abandoned, which in turn is a continuation of Application Ser. No. 904,144, filed May 9, 1978 and now abandoned.

BACKGROUND

Two techniques widely used in the fabrication of printed circuit boards are the additive process and the subtractive process.

In the manufacture of printed circuit boards by the subtractive process, there is adhered to the surface of a copper-clad laminate one surface of a dry, photoresist film; the other surface of the film is adhered to a film support. The photoresist layer is thereafter exposed to light according to a predetermined pattern. The support film is thereafter removed and the copper layer is exposed by washing away the unexposed areas of the photoresist layer. The exposed copper layer is then etched away by chemical milling.

In the additive process, there is adhered to the surface of a substrate (which may or may not be copper-clad) one surface of a dry photoresist film; the other surface is adhered to a film support. The dry photoresist layer is thereafter exposed to a predetermined light pattern and the support film is thereafter removed. The substrate is exposed by washing away the unexposed areas of the photoresist layer. At this point, the substrate is treated with appropriate sensitizers and metalizing solutions, whereby a layer of metal, usually copper, is applied to the substrate.

The dry photoresist films are typically formulated to contrast in color with the substrates with which they are used. Since they generally do not change color, it is extremely difficult to inspect the product after exposure to light but prior to removal of the unexposed areas of the photoresist film to insure that the light mask has been properly placed and to be sure that there are no imperfections or defects in the exposed photopolymerizable layer. It is extremely useful to have a dry photoresist film which visually indicates where the film has been exposed to light so that detection of defects can readily be made prior to developing the film and etching the copper-clad panels or building up a layer of metal on the exposed substrate.

It would also be useful to have a liquid photopolymerizable system that is colorless or lightly colored in the unexposed state and which both crosslinks and becomes intensely colored upon exposure to actinic light.

DESCRIPTION OF THE PRIOR ART

Prior artisans who have worked on phototropic photosensitive compositions have generally used the halogenated methanes and ethanes such as $CBr_4$, $CCl_4$, $CHBr_3$, $CHCl_3$, $CHI_3$ etc. While these materials work in a laboratory context, their volatility makes fabrication of products having a reasonable shelf-life virtually impossible. Further, the toxicity of these materials renders them dangerous to work with.

Work done by Toshio Yamazaki, Harriet J. Cook and Melvin A. Lipson at Dynachem Corporation showed that stable phototropic photosensitive compositions could be obtained using the normally solid amide of a halogenated aliphatic carboxylic acid as an activator for the free base of an amino dyestuff. This work is embodied in U.S. Pat. No. 4,065,315.

The general preference of the prior art in respect of organic halides used as activators is for there to be more than one halogen atom bound to a single carbon atom; particularly preferred are those compounds having three halogen atoms bound to a single carbon atom. Thus, such compounds as trichloroacetamide and tribromoacetamide are particularly preferred in the prior art.

SUMMARY OF THE INVENTION

It has now been found that carbonylic halides can be used to formulate stable, phototropic, photosensitive compositions. The carbonylic halide can be an aliphatic ketone, a cycloaliphatic ketone or an ester or amide of an aliphatic dicarboxylic acid.

In one embodiment of the invention, there is provided a phototropic photosensitive composition which comprises a. at least one component capable of curing, crosslinking or polymerizing upon suitable initiation.

b. an initiator for said component that is potentiated by actinic radiation.

c. a colorformer capable of becoming more intensely colored upon contact with a color activator, and d. a latent activator for the colorformer that is capable of activating the colorformer under the influence of actinic light, comprising a carbonylic halide.

One aspect of this embodiment of the invention relates to the product obtained upon exposing the phototropic photosensitive composition to actinic radiation.

Another embodiment of the invention relates to a dry photoimagable composition, as described, in the form of a thin layer and especially to an assembly comprising a support sheet, a layer of a dry phototropic photosensitive composition as described, one surface of which is adhered to the support sheet, and a transparent sheet adhered to the other surface of said composition.

In another embodiment, the invention relates to a phototropic photosensitive composition, as described, on a support. In one aspect of this embodiment, the support is a conductive metal layer, one surface of which can be in contact with a coextensive surface of an insulating layer. In another aspect of this embodiment, the support is non-conductive.

In yet another aspect the invention relates to solvent-free liquid, actinic radiation curable coating or printing compositions which comprise a. at least one component capable of curing, crosslinking or polymerizing upon suitable initiation, b. an initiator for said component that is potentiated by actinic radiation, c. a colorformer capable of becoming more intensely colored upon contact with a color activator, d. a latent activator for the colorformer that is capable of activating the fluoran colorformer under the influence of actinic light, comprising a carbonylic halide.

These compositions can be applied as decorative or protective coatings to provide highly coloured cured products upon exposure to actinic radiation.

DETAILED DESCRIPTION

As indicated above, the invention involves a phototropic photopolymerizable composition comprising:

a. at least one component capable of curing crosslinking or polymerizing upon suitable initiation, b. an initiator for said component that is potentiated by actinic radiation, c. a colorformer capable of becoming more intensely colored upon contact with a color activator, d. a latent activator for the colorformer that is capable of activating the colorformer under the influence of actinic light, comprising a carbonylic halide.

As used herein, the term "phototropic" is intended to identify the capability of a system, such as the composition described above, to darken in response to actinic light; the term is derived from "photo" —indicating light or radiant energy and "tropic" —changing or tending to change in a specified manner in response to a specified stimulus.

As indicated, there is contemplated a photosensitive compound that contains at least one component capable of curing, crosslinking or polymerizing upon suitable initiation. In one aspect, this component contains at least one polymerizable ethylenically unsaturated group of structure

capable of curing, crosslinking or polymerizing under the influence of free radicals. Of these materials, one important class is characterized by the presence of at least one acrylyl or methacrylyl group of formula:

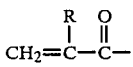

where R is hydrogen or methyl. Monomers, polymers, oligomers and compositions whose functionality is attributable to the presence of acrylate and/or methacrylate groups include acrylic acid, methacrylic acid, acrylamide, methacrylamide, methyl acrylate, methyl methacrylate, ethyl acrylate, ethyl methacrylate, hexyl acrylate, cyclohexyl methacrylate, 2-ethylhexyl acrylate, butoxyethoxyethyl acrylate, bicyclo (2.2.1) hept-2-yl acrylate, dicyclopentenyl acrylate, isodecyl acrylate, ethylene diacrylate, diethylene glycol diacrylate, glycerol diacrylate, glycerol triacrylate, ethylene dimethacrylate; ethylene glycol diacrylate, ethylene glycol dimethacrylate, 1,2,4-butanetriol trimethacrylate, 1,4-benzenediol dimethacrylate, 1,4-cyclohexanediol diacrylate, neopentyl glycol diacrylate, triethylene glycol diacrylate, tetraethyleneglycol diacrylate, pentaerythritol mono-, di-, tri- or tetracrylate or mixtures thereof, pentaerythritol tri-or tetramethacrylate, 1,5-pentanediol dimethacrylate, trimethylol propane mono-, di, or triacrylate or mixtures thereof, 2-phenoxyethyl acrylate, glycidyl acrylate, 2-ethoxyethyl acrylate, 2-methoxythyl acrylate, 2-(N,N-diethylamino) ethyl acrylate, omega-methoxyethyl (undecaoxyethylene) acrylate, omega-tridecoxyethyl (undecaoxyethylene) acrylate, trimethoxyallyloxymethyl acrylate, bicyclo (2.2.1) hept-2-en-5-ylmethyl acrylate, bicyclo (2.2.1) hept-2-en-5,6-diyl diacrylate, vinyl acrylate, 2-hydroxypropyl acrylate, 2-hydroxyethyl acrylate, (methyl carbamyl) ethyl acrylate and the bis-acrylates and methacrylate of polyethylene glycols of molecular weight 200–1500.

One group of acrylyl and methacrylyl esters that are particularly useful have the general formula

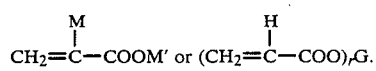

Where the acrylyl compound has the formula

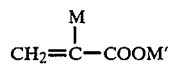

M is H or $CH_3$

M' is cycloalkyl of 5 to 12 carbon atoms (such as cyclopentyl, dicyclopentyl, methyclyclopentyl, dimethylcyclopentyl, etc.)

cycloalkenyl of 5 to 12 carbon atoms (such as cyclopentenyl, methylcyclopentenyl, dicyclopentenyl, bicyclo (2.2.1) hept-2-en-yl, etc.)

—$C_pH_{2p}M''$ or $(C_qH_{2q}O)_s C_qH_{2q+1}$;

where p is an integer from 1 to 10 q is an integer from 2 to 4 s is an integer from 0 to 4

M'' is hydrogen, hydroxyl, phenoxy, alkoxy of 1 to 8 carbon atoms; and where the acrylyl compound has the formula

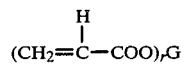

G is a polyvalent alkylene group of formula

—$C_xH_{2x-y}$— in which x is an integer from 2 to 8 y is an integer from 0 to 2

(for example, divalent alkylene when y=0 such as —$C_2H_4$—, $C_3H_6$—iso—$C_3H_6$—, —$C_5H_{10}$—, neo—$C_6H_{12}$ etc; trivalent alkylene when y=1 such as

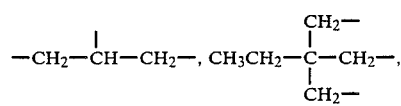

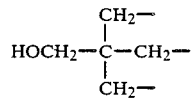

or tetravalent alkylene when y is 2, such as

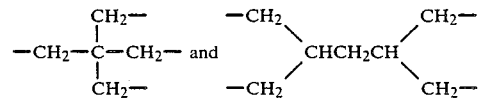

etc.)
or G is a divalent ether or ester group of formula $$-(C_qH_{2q}O)_t\, C_qH_{2q}-$$

or $$-(C_qH_{2q}COO)_t\, C_qH_{2q}-$$

where t is an integer from 1 to 5 and q is an integer from 2 to 4 (such as oxyethylene, oxypropylene, oxybutylene, polyoxyethylene, polyoxypropylene, polyoxybutylene, etc.) and r is the valence of G and can be 2 to 4.

Triethyleneglycol diacrylate, tetraethylene glycol diacrylate, pentaerythritol triacrylate, trimethylolpropane triacrylate and pentacrythritol tetraacrylate are especially useful.

Acrylate or methacrylate functionality can be incorporated in polymers and oligomers having carboxyl, hydroxyl oxirane or isocyanate groups via reaction with acrylic monomers. Addition reactions of isocyanates to form urethanes or oxiranes to form esters are relatively straightforward. Other methods of acrylation involving condensation or ester interchange reactions are well known.

Thus, there can be used epoxy acrylates obtained by reacting an epoxy resin with acrylic or methacrylic acid or obtained by reacting a hydroxyalkyl acrylate with an anhydride and reacting that product with a diepoxide. Oils, such as soybean oil and linseed oil, can be epoxidized and acrylated.

Polyester resins, for example from a glycol-dibasic acid condensation, can be acrylated by using acrylic or methacrylic acid to complete the esterification. Another method uses the reaction of an anhydride with a mixture of propylene oxide and glycidyl acrylate to obtain an acrylated polyester.

Acrylated alkyd resins are obtained by the reaction of, for example, a triol, dibasic acid, phthalic anhydride and a fatty acid such as hydrogenated castor oil. After reaction is complete acrylation is achieved by direct esterification with acrylic acid.

Urethane acrylates can be prepared directly by the reaction of a diisocyanate with an hydroxyalkyl acrylate, such as 2-hydroxyethyl acrylate. Oligomers are obtained by using an isocyanate-terminated urethane prepolymer for reaction with the hydroxyalkyl acrylate. The urethane prepolymer can be of the polyether or polyester type.

Acrylate functionality can be incorporated in a variety of polymer backbones by incorporating glycidyl methacrylate into the polymer chain and then reacting the pendant oxirane groups with acrylic or methacrylic acid.

Other curable systems are based on unsaturated polyesters such as are obtained from fumaric acid, 4,4'-stilbenedicarboxylic acid, maleic acid, and diallyl ether.

Cinnamate ester groups are also useful, for example in a polyvinyl alcohol-cinnamate ester combination and in conjunction with a variety of polymer materials: polycarbonate cinnamate; polyurethane cinnamate; cinnamyl-modified poly(meth)acrylates; polyepichlorohydrin/cinnamate; poly(cinnamyl methacrylate); epoxy cinnamylidene acetate; carboxycinnamate modified polyesters.

Curable materials are also obtainable from the 2-phenylmaleimido group, allyl ester-maleimide combinations, allthioether polymers, aromatic polysulfone polymer, polysiloxanes, chalcones, sorbic acid derivatives, itaconic acid derivatives and mixtures containing itaconic acid; polyvinyl alcohol, polyvinyl acetate, polyvinyl butyral.

Another polymerizable or curable polymer system is based on the free-radical addition of a thiol to an olefinic double bond:

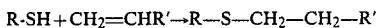

When a polyene and a polythiol are admixed and a stimulus that generates free-radicals is present, rapid curing occurs by simultaneous chain extending and crosslinking reactions.

Other crosslinkable, polymerizable or curable materials include the nitriles such as acrylonitrile and methacrylonitrile; the olefins such as dodecene, styrene, 4-methylstyrene, alphamethylstyrene, cyclopentadiene, dicyclopentadiene, butadiene, 1,4-hexadiene, 4-methyl-1-pentene, bicyclo(2.2.1) hept-2-ene, bicyclo(2.2.1) hept-2.5-diene, cyclohexene; the vinyl halides such as vinyl chloride, vinylidene chloride; the vinyl esters such as vinyl acetate, vinyl butyrate, vinyl benzoate, vinyl butyral, vinyl methacrylate, vinyl crotonate; the vinyl ketones such as vinyl methyl ketone, vinyl phenyl ketone, isopropenyl methyl ketone, divinyl ketone, alpha-chloro-vinyl methyl ketone, vinyl phenyl ketone; acrolein and methacrolein; the vinyl ethers and thioethers such as methyl vinyl ether, ethyl vinyl ether, divinyl ether, isopropyl vinyl ether, the butyl vinyl ethers, 2-ethylhexyl vinyl ether, vinyl 2-chloro-ether, vinyl 2-methoxyethyl ether, n-hexadecyl vinyl ether, vinyl methyl sulfide, vinyl ethylsulfide, divinyl sulfide, 1-chloroethyl vinyl sulfide, vinyl octadecyl sulfide, vinyl 2-ethoxyethyl sulfide, vinyl phenyl sulfide, diallyl sulfide; the miscellaneous sulfur and nitrogen containing monomers such as divinyl sulfone, vinyl ethyl sulfone, vinyl sulfonic acid, vinyl ethyl sulfoxide, sodium vinyl sulfonate, vinyl sulfonamide, vinyl pyridine, N-vinyl pyrollidone, N-vinyl carbazole. Other curable materials are readily apparent to oneh skilled in the art of polymerization chemistry. The specific compounds mentioned are illustrative only and not all-inclusive. They can be polymerized alone or in mixtures of two or more thereof with the proportions thereof dependent upon the desire of the individual. They can also be blended with polymers.

The component capable of curing, crosslinking or polymerizing upon suitable initiation can be used alone in mixtures and/or in conjunction with one or more preformed polymers.

Among the polymers that can be used one can include, for example, the polyolefins and modified polyolefins, the vinyl polymers, the polyethers, the polyesters, the polylactones, the polyamides, the polyurethanes, the polyureas, the polysiloxanes, the polysulfides, the polysulfones, the polyformaldehydes, the phenolformaldehyde polymers, the natural and modified natural polymers, the heterocyclic polymers.

The term preformed polymer as used herein includes the homopolymers and copolymers and includes the olefin polymers and copolymers such as polyethylene, poly(ethylene/propylene), poly-(ethylene/norbornadiene), poly(ethylene/vinyl acetate), poly(ethylene/vinyl chloride), poly(ethylene/ethyl acrylate), poly(ethylene/acrylonitrile), poly(ethylene/acrylic acid), poly(ethylene/styrene), poly(ethylene/vinyl ethyl ether), poly(ethylene/vinyl methyl ketone), polybutadiene, poly(butadiene/styrene/acrylonitrile), poly(vinyl-chloride), poly(vinylidene chloride), poly(vinyl acetate), poly(vinyl methyl ether), poly(vinyl butyral), polystyrene, poly(N-vinylcarbazole), poly(acrylic acid), poly(methyl acrylate), poly(ethyl acrylate), polyacrylonitrile, polyacrylamide, poly(methacrylic acid), poly(methyl methacrylate), poly(ethyl methacrylate), poly(N,N-dimethyl acrylamide), poly(methacrylamide), polycaprolactone, poly(caprolactone/vinyl chloride), poly(ethylene glycol terephthalate), poly(captolactam), poly(ethylene oxide), poly(propylene oxide), copolymers of ethylene oxide and propylene oxide with starters containing reactive hydrogen atoms such as the mixed copolymer using ethylene glycol or glycerol or sucrose, etc., as starter, the natural and modified natural polymers such as gutta percha, cellulose, methyl cellulose, starch, silk, wool, and the siloxane polymers and copolymers, the polysulfides and polysulfones, the formaldehyde polymers such as polyformaldehyde, formaldehyde resins such as phenol-formaldehyde, melamineformaldehyde, urea-formaldehyde, aniline-formaldehyde and acetone-formaldehyde.

Selection of the preformed polymer will usually depend on the properties desired of the ultimate, cured product.

The materials utilized as curing, crosslinking or polymerization initiators are radiation-sensitive catalyst precursors that are potentiated by radiation to provide an effective initiator species. Ultraviolet light irradiation is the preferred mode of irradiation.

The known photoinitiators include the azo compounds, organic dyes, sulfur containing compounds, metallic salts and complexes, oximes, amines, polynuclear compounds, peroxides, various halogen-containing compounds and organic carbonyl compounds; they can be used alone, in combination with each other or in combination with various synergistic agents.

The aromatic carbonyl compounds are a quite important group of photoinitiators and include benzoin and the benzoin ethers, benzophenone and derivatives of benzophenone, the monoaryl ketones, the diketones, the xanthones, the thioxanthemones, the quinones, and the thioketones.

In the group of benzoin and the benzoin ethers are included such ethers as benzoin methyl ether; benzoin ethyl ether; benzoin allyl ether; benzoin propyl ether; benzoin isopropyl ether; benzoin butyl ether; benzoin isobutyl ether; benzoin sec-butyl ether; benzoin thiophenyl ether; benzoin amyl ether; benzoin hexyl ether; benzoin octyl ether; benzoin 2-ethylhexyl ether; benzoin nonyl ether; benzoin trimethyhexyl ether; benzoin diethyl ether; benzoin phenyl ether; hydroxyethyl benzoin ether; ethylene glycol benzoin ether; 2-chloroethylbenzoin ether; benzoin isobutoxymethyl ether; α-alkoxybenzoin ethers; benzoin carbamates.

In the group of benzophenone and derivatives of benzophenone are the 4,4'-di(loweralkyl)benzophenones; 4,4'-di(lower alkoxy)benzophenones; 4,4'-diallylbenzophenone; 4,4'-divinylbenzophenone; 4,4'-di(loweracyl)benzophenone; the alkylamino-benzophenones including 4'(dimethylamino)benzophenone; 4-hydroxy-4'-(dimethylamino)benzophenone; 4-hydroxy-4'-(diethylamino)benzophenone; 4-acryloxy-4'-(dimethylamino)benzophenone; 4-methoxy-4'-(dimethylamino)benzophenone; 4,4'-bis(diamino)benzophenone; 4,4'-bis-(dimethylamino)benzophenone; 4,4'-bis-(diethylamino)benzophenone; and p-dichloromethylbenzophenone; 4-iodobenzophenone; p-chlorobenzophenone; 4,4'-bis(bromomethyl)benzophenone; p-hydroxybenzophenone; 2-hydroxy-4-methoxybenzophenone-5-sulfonic acid; p-acryloxybenzophenone; o-methoxybenzophenone; p-methoxybenzophenone; glycidyl ethers of benzophenone; vinyl-substituted benzophenone; 2-isopropenylbenzophenone; monocarboxyl-substituted benzophenone; polycarboxyl-substituted benzophenone; p-nitrobenzophenone; m-benzophenonesulfonyl chloride; p-p'-bis(dimethylamino)thiobenzophenone; phenylthiomethylbenzophenone; benzylthiomethylbenzophenone; benzopinacolone; anthrone; benzanthrone; benzanthronesulfonyl chloride; 9-fluorenone; hydroxyfluorenones; aminofluorenones; 2-bromoethyl-9-fluorenonesulfonyl chloride; 2-methylfluorenone; 1-propylfluorenone; 2,7-dimethylfluorenene; 2-vinylfluorenone; 2-benzylfluorenone; 2-ethoxyfluorenone; 2,6-dimethoxyfluorenone; 2,4,5-trimethylfluorenone; 2-acetylfluorenone; 2-chlorofluorenone; 2,7-dichlorofluorenone; dibenzosuberone; 1-chloromethyl-6-chlorosulfonyl-2-naphthylphenyl ketone; n-methylacridone; poly(vinyl benzophenone).

The monoaryl ketones include acetophenone, propiophenone, butyrophenone, 3-methylacetophenone, 4-vinylacetophenone, 4-(2-ethylhexyl)-acetophenone, 3-allylacetophenone, 4-vinylacetophenone, 4-hexylpropiophenone, 3-butenylbutyrophenone, 4-tolylacetophenone, 3-benzylacetophenone, 3-xylylacetophenone, 3-methoxyacetophenone, 3-methoxybutyrophenone, 3-decoxyacetophenone, 4-heptoxypropiophenone, 3-bromoacetophenone, 4-chloroacetophenone, 3-chloropropiophenone, 4-iodoacetophenone, 1,4-diacetylbenzene, 1,3-diacetylbenzene, 1,3,4-triacetylbenzene, 1,4-dipropionylbenzene, 1,4-dibutyrobenzene, 3,4-dimethylacetophenone, 1-chloroacetophenone, 1-bromoacetophenone, 1,1'-dichlorobenzophenone, 1-chloroanthraquinone, 1-bromoanthraquinone, 1-chloroxanthane, 1-chlorothioxanthane, 2-chlorothioxanthane, 2,2'-dipyridylketone, 2-benzolypyridine, 3-benzoylpyridine, 4-benzoylpyridine, 3,4-dihexylacetophenone, 3,4-diethylpropiophenone, 3-methyl-4-methoxyacetophenone, chloroalkylphenyl ketones;

α-bromoacetophenone; ortho-bromoacetophenone; trichloroacetophenone; trichloroethylidineacetophenone; 2,2-dichloro-4'-tertiary-butylacetophenone; 2,2,2-trichloro-4'-tertiary-butylacetophenone; α-bromoisobutyrophenone; 2,2-dibromo-2(phenylsulfonyl)acetophenone; α,α-dialkoxyacetophenone; 2,2-dimethoxyacetophenone; 2,2-dimethoxy-2-phenylacetophenone; 2,2-diethoxyacetophenone; o-methoxyacetophenone; m-methoxyacetophenone; p-methoxyacetophenone; 2-butoxy-2-phenylacetophenone; 2-phenylthio-2-phenylacetophenone; ethyl benzoylacetate; para-aminophenyl ketones; cyclohexylphenyl ketone; pivalophenone; valerophenone; and acetonaphthone.

The diketones include biacetyl; benzil dimethyl ketal; 2,3-dibenzoyl-2-norbornene; benzoylbenzal chloride; 2,2-dibromo-2-(phenylsulfonyl)propanedione; a-naphthil; 2,3-butanedione; benzil; pentanedione; 1-aryl-1,2-propanediones; 2,3-bornanedione; phenylpyruvic acid; 2,4-pentanedione.

The xanthones and thioxanthenones include xanthone, 2-methylxanthone, 3-pentylxanthone, 2,6-diethylxanthone, 2-tolyxanthone, 2-methoxyxanthone, 4-methoxyxanthone, 2-acetylxanthone, 2,7-diacetylxanthone, 3-chloroxanthone, 4-bromoxanthone, 2-chloroxanthone, 2,7-dichloroxanthone, 2-chloro-G-nonylxanthone, 2-iodo-5-methoxyxanthone, thioxanthenone; 2- methylthioxanthenone; 3,6-bis(dimethylamino) thioxanthenone; 2-chlorothioxanthenone.

The quinones include p-benzoquinone; o-benzoquinonediazide; anthraquinone; alkylanthraquinones; 2-methylanthraquinone; 2-ethylanthraquinone; 2-tertiary-butylanthraquinone; 2,6-dimethylanthraquinone; 1,5-diethylanthraquinone; 2-vinylanthraquinone; 2-xylylanthraquinone; 2,6-dimethoxyanthraquinone; 2,7-diethoxyanthraquinone; 2-acetylanthraquinone; 2-chloroanthraquinone; 2,4,8-trichloranthraquinone; 2-bromoanthraquinone; aminoanthraquinone; 1,5-diaminoanthraquinone; piperidinoanthraquinones; anthraquinonesulfonyl chloride; benzanthraquinone; 1,4-napthoquinone derivatives; phenanthrenequinones; a-chloroanthraquinone;

The thioketones include thiobenzophenone; p,p'-dimethoxythiobenzophenone; p,p'-bis(dimethylamino)-thiobenzophenone.

The azo compounds that are useful include azo compounds, azido compounds and diazonium salts. Azo and azido compounds include 2,2'-azobisisopropane; azobisisobutyronitrile; 2-phenylazobisisobutyronitrile; azobisisobutyramide; azobis (isobutyl acetate); di-(2,4,6-tribromophenyl)-4,4'-azobis (4-cyanovalerate); p-azidobenzaldehyde; b-naphthalenesulfonyl azide; diazomethane; bis(phenylsulfonyl)diazomethane; diazonaphthalenes; diazothioethers; quinone diazides; m,m'-azoxystyrene.

The sulfur containing compounds include n-dodecyl mercaptan; 2-mercaptobenzimidazole; diphenyl sulfide; cyclohexylphenylsulfide; benzoin thioethers; benzoin thiophenyl ether; phenylthiomethylbenzophenone; s,s'-diphenyl dithiocarbonate; calcium sulfide; metallic tellurides; diaryl disulfides; diphenyl disulfide; dithiolane; dibenzoyldisulfide; dixanthate; benzothiazoles; 2,2'-dithiobis(benzothiazole); 2-mercaptobenzothiazole; thiazolines; thiocarbamates; dithiocarbamic esters; dithiocarbamic anhydrides; thiurams; toluene sulfonic acid; sulfonyl chlorides; m-(chlorosulfonyl)benzyl chloride; naphthalenesulfonyl chloride; 2-bromoethyl-9-fluorenonesulfonyl chloride; 2,2-dibromo-2(phenylsulfonyl)acetophenone; 2,2-dibromo-2(phenylsulfonyl)-propanedione; benzophenonesulfonyl chloride; diphenyl disulfone.

The oximes include o-acyloximes; 1-phenyl-1,2-propanedione-2-o-benzoyl oxime; oxido-oxazole; benzylmonooxime.

The polynuclear compounds include naphthalene; halogenated naphthalenes; 2,3,6-trimethylnaphthalene; a-naphthol; 1-aminonaphthalene; 1-methoxynaphthalene; 2,3-diphenylquinoxaline; anthracene; aminoanthraquinone; phenanthrene; naphthacene; fluorene; 9-fluorenone; stilbene; trinitrofluorenone; polynuclear quinones.

The metal salts and complexes include zinc chloride; zinc bromide; zinc sulfide; ferric chloride; chromium chloride; nickel chloride; tin chloride; stannous chloride; vanadium tetrachloride; vanadium oxychloride; vanadium naphthenate; aluminum chloride; aluminum bromide; aluminum iodide; silver halides; gold salts; sodium chloraurate; mercury salts; mercury iodosulfide; titanium tetrachloride; cadmium sulfide; boron trifluoride; boron trichloride; ceric salts; thallium salts; uranyl salts; cobalt octoate; cobalt naphthenate; magnesium oxide; zinc oxide; titanium dioxide; alumina; cupric oxide; chromium oxide; silver oxide compounds; metal chelates; metal amine complexes; cobalt EDTA complexes; iron EDTA complexes; metal acetylacetonate; manganese tris(acetylacetonate); metal salt-saccharide complexes; metal oxalato complexes; p-benzoquinone complexes; copper (I) complexes; manganese carbonyl; rhenium carbonyl; osmium carbonyl; iron carbonyls; metal thiocarbonyls; trialkylaluminum; diethylaluminum chloride; triphenylmethyldiethyltitanium chloride; bis(2-chloroethyl)diethyltitanium; tetrabenzyltitanium; ferrocene; cyclopentadienylmanganese tricarbonyls.

The peroxides include hydrogen peroxide; benzoyl peroxide; tertiary-butyl peroctoate; t-butyl a-cyanoperacetate; t-butyl hydroperoxide; di-t-butyl peroxide; cumene hydroperoxide; a-cumyl peroxide; ergosterol peroxide; fluorenone hydroperoxide; acetyl peroxide.

The imidazoles include benzimidazoles; 2-methylbenzimidazole; 2-mercaptobenzimidazole; triphenylimidazolyl dimers:

Ammonium salts include bipyridylium salt; benzyltrimethylammonium chloride.

Organic dyes that are useful include acridines; benzacridine; benzidines; b-carotene; chlorophyll; crystal violet; eosin; erythrosine; fluorescein; indanthrene yellow; irgazin yellow; methyl violet; methylene blue; pyronine-G; rhodamines; riboflavin; rose bengal; thiazine dyes; thionine; xanthene dyes; xanthophyll; iodoeosine.

Where the component capable of curing, crosslinking or polymerization contains an ethylenically unsaturated group, and notably an acrylyl or methacrylyl group, the preferred free radical photoinitiators are the benzoin ethers, benzophenone, the alkylamino benzophenones, the xanthones, the thioxanthones as well as combinations of said photoinitiators with each other and with chain transfer agents such as organic amines. As colorformer, there can, in one aspect, be used the free base of:

(a) an amino derivative of a triarylmethane dye (b) an amino derivative of a xanthene dye (c) an amino derivative of an acridine dye (d) a methine or polymethine dye As ketone imine dyestuffs, there can be used the free bases of Auramine O and Auramine G, C.I. 41000B and 41005.

The amino triarylmethane dyestuffs whose free bases can be used, can be generally represented by the formula

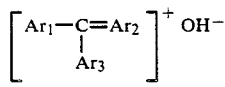

Where $Ar_1$, $Ar_2$ and $Ar_3$ are carbocyclic aryl groups that are unsubstituted or substituted by one to three of: lower alkyl, lower alkoxy, lower acyl, carboxyl, carboloweralkoxy, sulfo, including the alkali, alkaline earth metal and ammonium salts thereof, nitro, halo, hydroxyl and amino of formula

where R' and R" each independently is hydrogen, lower alkyl, phenylloweralkylene, phenyl, sulfoloweralkylene, lower acyl, naphthyl, and where said phenyl and naphthyl groups are optionally substituted by one to three of nitro, sulfo, hydroxyl, lower alkoxy, lower alkyl, amino, sulfamyl, carboxyl, carbamyl, phenylimino and halogen and provided that at least one of $Ar_1$, $Ar_2$ and $Ar_3$ contains at least one amino group of formula

and where $Ar_3$ can additionally be indolyl that is optionally substituted.

The triarylmethane dyes whose free bases are of particular interest herein can be more specifically represented by the following formula:

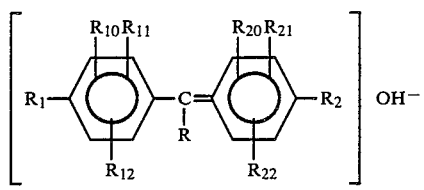

where R is carbocyclic or heterocyclic aryl of formula

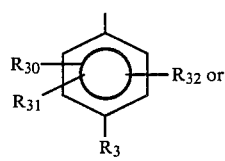 or

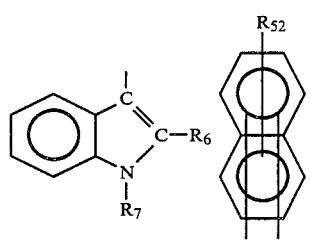

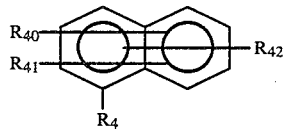

where $R_1$, $R_2$, $R_3$ and $R_4$ each independently is hydrogen, hydroxyl, or amino of formula

where R' and R" each independently is hydrogen, lower alkyl, lower acyl, sulfoloweralkylene, phenylloweralkylene, phenyl or naphthyl, said phenyl or said naphthyl groups being unsubstituted or substituted by one to three of nitro, sulfo, hydroxyl, lower alkoxy, lower alkyl, amino, sulfamyl, carbamyl, carboxyl, lower acyl, carboloweralkoxy, halogen or phenylimino where said phenyl group may be substituted as described; and where at least one of $R_1$, $R_2$, $R_3$ and $R_4$ is amino of formula

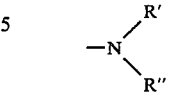

and $R_{10}$, $R_{11}$, $R_{12}$, $R_{20}$, $R_{21}$, $R_{22}$, $R_{30}$, $R_{31}$, $R_{32}$, $R_{40}$, $R_{41}$, $R_{42}$, $R_{50}$, $R_{51}$, and $R_{52}$, each independently is hydrogen, lower alkyl, hydroxyl, carboxyl, sulfo including the ammonium, alkali or alkaline earth metal salt thereof, nitro, halo, phenylazo, loweralkoxy, lower acyl, carboloweralkoxy, or amino of formula

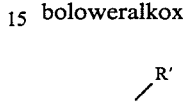

where R' and R" are as previously defined and $R_6$ is lower alkyl or phenyl and $R_7$ is hydrogen or lower alkyl.

The free bases of triarylmethane dyestuffs of the following formula are a preferred class of dyes

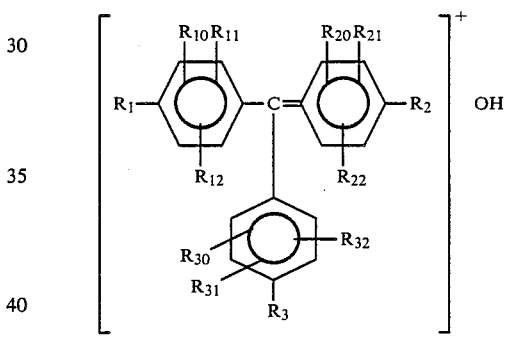

where the substituents are all as previously defined.

Within the family of dyes described by the formula immediately preceding, preferred are those where $R_1$, $R_2$ and $R_3$ are hydrogen or

where R' and R" each independently is hydrogen, alkyl of one to four carbonatoms, benzyl, phenyl, sulfoethylene and where said phenyl and benzyl are unsubstituted or substituted in the aromatic moiety by one to three of nitro, sulfo, hydroxyl, alkyl of one to four carbonatoms, alkoxy of one to four carbonatoms, amino or chloro.

Of the dyes set out immediately above, particularly preferred are those where $R_1$ and $R_2$ are

and $R_3$ is hydrogen, sodium sulfo or

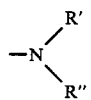

and where R' and R" each is hydrogen, methyl, ethyl, phenyl or sodium sulfo phenyl.

Especially preferred are the free bases of the dyestuffs having the formula

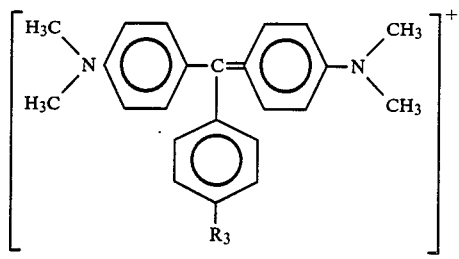

where $R_3$ is hydrogen or dimethyl amino.

The xanthene dyestuffs, whose free bases are useful herein, can be represented by the general formula:

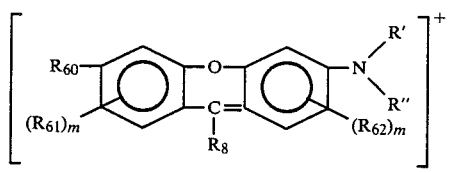

where $R_8$ is hydrogen or optionally substituted carbocyclic aryl $R_{60}$ is oxo, lower alkoxy, hydroxy or

where R' and R" are as previously defined; m is an integer from one to three and $R_{61}$ and $R_{62}$ are selected from the same group as $R_{10}$ and when m is two or three, the substituents can be the same or different.

A preferred group of xanthene dyestuffs are represented by the following structural formula:

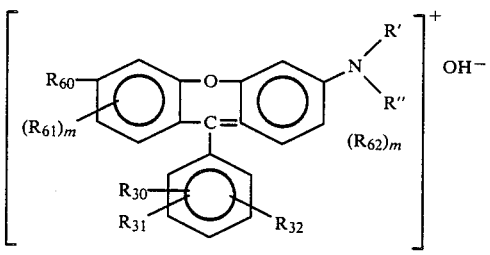

where $R_{60}$ is

m is one or two and $R_{30}$, $R_{31}$ and $R_{32}$ each independently is hydrogen, sulfamyl, sodium sulfo, halo, carboxyl, carboloweralkoxy, or hydroxyl.

A particularly preferred subgroup of compounds have the formula

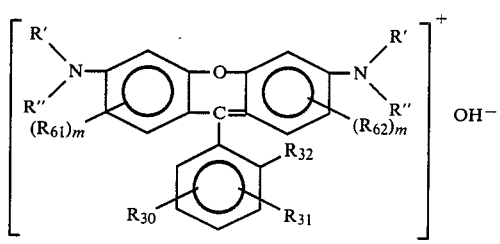

where R' and R" are hydrogen, lower alkyl, phenyl that is unsubstituted or substituted by lower alkyl or lower alkoxy $R_{61}$ is lower alkyl m is one $R_{32}$ is carboxyl or carboloweralkoxy $R_{30}$ and $R_{31}$ each independently is hydrogen, chloro, carboxyl or hydroxyl.

Amino derivatives of acridine dyestuffs whose free bases can successfully be employed herein have the general formula:

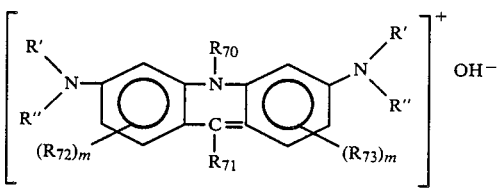

where $R_{70}$ is hydrogen or lower alkyl $R_{71}$ is hydrogen, lower alkyl or phenyl that is unsubstituted or substituted by amino, carboxyl or di(loweralkyl)amino, m is one, two or three $R_{72}$ and $R_{73}$ each independently is hydrogen, lower alkyl or halogen R' and R" are hydrogen or lower alkyl.

The methine and polymethine dyestuffs whose free bases can be used are those having Colour Index numbers C.I. 48010 through 48080.

It should be noted that the dyestuffs described hereinabove are independently known to the art, for example, the amino derivitives of triarylmethane dyestuffs that are useful are those having the indicated formula and having a Colour Index number between C.I. 42,000 and C.I. 4,520; useful amino derivitives of xanthene dyestuffs are those having the indicated formula and having a Colour Index number between C.I. 45,000 and C.I. 45,505; the acridine dyestuffs are those having a Colour Index number between C.I. 46,000 and C.I. 46,080.

In a second aspect, the colorformer can be a fluoran compound.

Fluoran colorformers contemplated herein are those having the following formula:

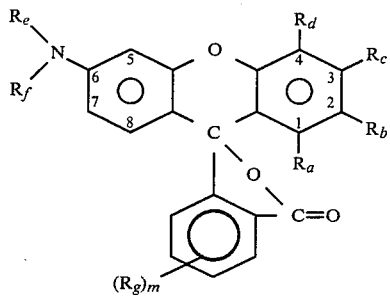

where
$R_a$ is hydrogen or an aliphatic group of one to 12 carbon atoms that is unsubstituted or optionally substituted and that may be interrupted by

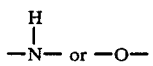

and that is bound directly via carbon or oxygen;
$R_b$ is an amino group where one or both hydrogen atoms are optionally replaced by unsubstituted or substituted aliphatic groups, cycloaliphatic groups, aromatic groups or mixed aliphatic-aromatic groups or $R_b$ is a heterocyclic group of 3 to 12 ring members bound via a ring nitrogen and containing in addition to nitrogen, one or more of oxygen and sulfur as hetero ring members
or $R_a$ and $R_b$ together form a condensed aromatic nucleus;
$R_c$ is hydrogen, halogen, an aliphatic group of one to 12 carbon atoms that is unsubstituted or substituted and that may be interrupted by nitrogen or oxygen and that is bound directly via carbon or oxygen, or $R_c$ is an amino group where one or both hydrogen atoms are optionally replaced by unsubstituted or substituted aliphatic groups, cycloaliphatic groups, aromatic groups, mixed aliphatic-aromatic groups or where $R_c$ is a heterocyclic group with three to twelve ring members containing one or more of nitrogen, oxygen and sulfur as hetero ring members or $R_c$ is an aromatic group that is unsubstituted or optionally substituted or a mixed aliphatic-aromatic group or an aromatic ether or aliphatic-aromatic ether group;
$R_d$ is hydrogen, lower aliphatic or an amino group where one or both hydrogen atoms are optionally replaced by unsubstituted or substituted aliphatic groups, cycloaliphatic groups, aromatic groups, mixed aliphatic-aromatic groups or $R_d$ is a heterocyclic group of 3 to 12 ring members containing one or more of nitrogen, oxygen and sulfur as hetero ring members;
$R_e$ and $R_f$ each independently is hydrogen, unsubstituted or substituted aliphatic of one to 12 carbon atoms which may be interrupted by oxygen or nitrogen, and which is bound directly via carbon, cycloaliphatic groups, aromatic groups, mixed aliphatic-aromatic groups, or $R_e$ and $R_f$, together with the nitrogen atom form a heterocyclic group of 3 to 12 ring members, optionally containing, in addition to nitrogen, one or more of sulfur and oxygen as hetero ring members;
$(R_g)_m$ represents one to 3, independently, of hydrogen, lower aliphatic bound directly via carbon or oxygen, or is halogen, acetamido or optionally substituted amino.

Preferably, at least one of $R_b$, $R_c$ and $R_d$ is an amino group, as defined.

Particularly useful are the 2-amino fluoran compounds of formula

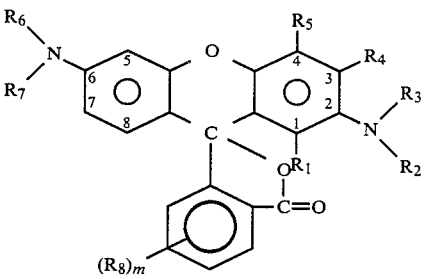

where
$R_1$ is hydrogen, halogen, alkyl of one to 12 carbon atoms, alkoxy of one to 12 carbon atoms
$R_2$ and $R_3$ each independently is hydrogen, alkyl of one to 12 carbon atoms, alkenyl of 2 to 12 carbon atoms alkoxyalkyl of 2 to 8 carbon atoms, alkoxycarbonylalkyl of 3 to 9 carbon atoms, cycloalkyl of 5 or 6 carbon atoms, acyl of one to 12 carbon atoms, phenyl, naphthyl or benzyl that are unsubstituted or substituted in the aromatic nucleus by one to 3 of amino, mono- or di-alkyl amino of one to 5 carbon atoms, alkyl of one to 7 carbon atoms, alkoxy of one to 7 carbon atoms, carboxyl, alkoxycarbonyl or 2 to 7 carbon atoms, acyl or acylamino of one to 5 carbon atoms, or $MeSO_3$— where Me is alkali metal
or $R_2$ and $R_3$ together with the associated nitrogen atom form a heterocyclic radical of 3 to 12 ring members selected from pyrrolidinyl; piperidyl, pipecolinyl, perhydroazepinyl, heptamethyleneimino, octamethyleneimino, indolinyl, 1,2,3,4-tetrahydroquinolinyl, hexahydrocarbazolyl, morpholinyl, thiomorpholinyl, piperazinyl, N-alkyl piperazinyl where the alkyl group contains one to 4 carbon atoms, pyrazolinyl, or 3-methyl pyrazolinyl
$R_4$ is hydrogen, alkyl of one to 12 carbon atoms, alkoxy of one to 12 carbon atoms, halogen, amino that is unsubstituted or substituted by one or two of the substituents as defined for $R_2$ and $R_3$, or $R_4$ is phenyl, phenoxy, benzyl or benzyloxy that is unsubstituted or substituted in the aromatic nucleus by one to 3 of amino, mono- or di-alkyl amino of one to 5 carbon atoms, lower alkyl, lower alkoxy, carboxyl, alkoxycarbonyl of 2 to 7 carbon atoms, acyl of one to 5 carbon atoms or $MeSO_3$— where Me is alkali metal
$R_5$ is hydrogen, lower alkyl, lower alkoxy or amino that is unsubstituted or substituted by one or two of the substituents as defined for $R_2$ and $R_3$, including the heterocyclic members,
$R_6$ and $R_7$, each independently is selected from the same group as defined for $R_2$ and $R_3$, including the heterocyclic members thereof;
$(R_8)_m$ represents one to 3 members independently selected from hydrogen, alkyl of one to 7 carbon atoms, alkoxy of one to 7 carbon atoms, halogen, acetamido, amino or mono- or di-alkyl amino of one to 7 carbon atoms.

Of the compounds described above, those wherein $R_1$ $R_5$ and $R_8$ are hydrogen are of particular interest. These compounds have the general formula

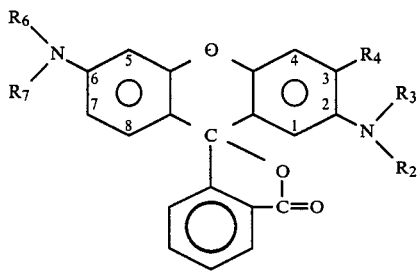

where $R_2$, $R_3$, $R_4$, $R_6$ and $R_7$ are all as previously defined.

Of special interest are the compounds having the preceding formula wherein $R_2$ is hydrogen, alkyl of one to 7 carbon atoms or acyl of one to 7 carbon atoms $R_3$ is hydrogen, alkyl of one to 7 carbon atoms, acyl of one to 7 carbon atoms, phenyl, benzyl or naphthyl or where $R_2$ and $R_3$ together with the associated nitrogen atom form morpholinyl, piperazinyl, pyrrolidinyl or piperidinyl $R_4$ is hydrogen, alkyl of one to 7 carbon atoms or alkoxy of one to 7 carbon atoms $R_6$ and $R_7$ is each alkyl of one to 5 carbon atoms or together with the associated nitrogen form morpholinyl, piperazinyl, pyrrolidinyl or piperidinyl.

Especially preferred are the compounds of formula

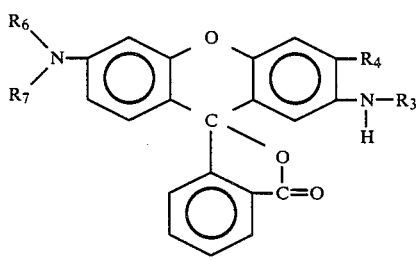

where $R_3$ is hydrogen or phenyl $R_4$ is hydrogen, ($C_1$-$C_3$) alkyl or ($C_1$-$C_3$) alkoxy $R_6$ and $R_7$ is each ($C_1$-$C_3$) alkyl; the compounds found to be notably useful are these where $R_6$ and $R_7$ are both ethyl and where $R_4$ is hydrogen, methyl or methoxy.

Fluoran compounds as described herein are known in the art; they are prepared by reacting a suitable benzophenone with an appropriate phenol derivative in the presence of an acidic condensing agent according to the following general formula

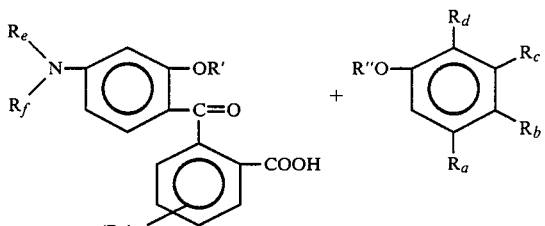

where $R_a$, $R_b$, $R_c$, $R_d$, $R_e$, $R_f$ and $R_g$ are as previously defined and R' and R" are hydrogen or lower alkyl, preferably hydrogen.

The reaction is typically carried out at 10° to 100° C. in the presence of a condensing agent such as acetic anhydride, sulfuric acid, zinc chloride, phosphorous oxychloride and polyphosphoric acid for from 3 to 6 hours; after cooling, the solution is poured into ice water and the product is neutralized with suitable alkali such as an alkali metal hydroxide solution. The crystals are then recovered and purified in known manner, as by recrystallization.

The benzophenone compound can be prepared by reacting a phenol derivative with a phthalic anhydride in an organic solvent such as benzene, toluene, xylene and chlorobenzene, at reflux:

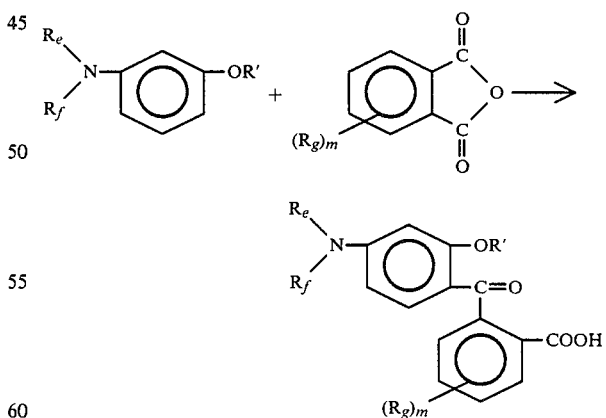

The general art of making fluoran compounds useful herein is described in U.S. Patent Nos.

U.S. Pat. No. 4,007,195
U.S. Pat. No. 3,997,561
U.S. Pat. No. 3,929,831
U.S. Pat. No. 3,681,392
U.S. Pat. No. 3,514,310

U.S. Pat. No. 3,501,331
and in British Patents No.
No. 1,339,316
No. 1,269,601
No. 1,211,393
the compounds described in these patents are also useful herein.

In describing the activators within the scope of this invention, it must be understood that the colorformers described herein are converted to dark-colored products by contact with an acidic substance. The acidic materials are those falling within the definition of a Lewis acid, that is, an electron acceptor. Thus the activators useful herein will either generate a Lewis acid or will facilitate the production of a Lewis acid from some other source.

The activators of this invention are the combination of a proton donor and a carbonylic halide in the presence of a free radical type photoinitiator. While not wishing to be bound to any theoretical explanation for the chemistry of this activator system, the perceived results may be explained as follows. The proton donor (PD), whether by the effect of the free radical initiator (In) or otherwise, provides protons that are effective to convert the colorformer to the dark colored reaction product. The carbonylic halide compound, functioning as an electron sink, pushes the reaction to the right, encouraging proton formation:

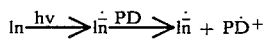

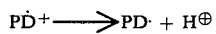

The proton donor can be an amine, an arsine or a phosphine and can be represented by the formula

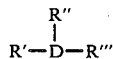

where D is N, As or P R' and R", each independently is hydrogen, linear or branched alkyl of from 1 to about 12 carbon atoms, linear or branched alkenyl of from 2 to about 12 carbon atoms, cycloalkyl of from 3 to about 10 ring carbon atoms, cycloalkenyl of from 3 to about 10 ring carbon atoms, aryl of from 6 to 12 ring carbon atoms, alkaryl of from 6 to about 12 ring carbon atoms, aralkyl of from 6 to about 12 ring carbon atoms, R''' has the same meaning as R' and R" except that it cannot be hydrogen and cannot be aryl when both R' and R" are aryl; the aryl groups can be unsubstituted or substituted by one or more of amino, mono- or di(lower alkyl) amino loweralkylcarbonyl, loweralkoxycarbonyl, loweralkylcarbonyloxy, phenylcarbonyl or aminophenylenecarbonyl where the amino group is unsubstituted or substituted by lower alkyl.

Additionally, R" and R''' together with D can form a heterocyclic group. Thus R" and R''' together can be divalent alkylene of 2 to 12 carbon atoms, divalent alkenylene of 3 to 12 carbon atoms, divalent alkadienylene of 5 to 10 carbon atoms, divalent alkatrienylene of from 5 to 10 carbon atoms, divalent alkyleneoxyalkylene having a total of from 1 to 12 carbon atoms or divalent alkyleneaminoalkylene having a total of from 4 to 12 carbon atoms.

Because of ready availability, lower toxicity and stability, the amines are preferred; representative specific organiamines include methylamine, dimethylamine, trimethylamine, diethylamine, triethylamine, propylamine, isopropylamine, diisopropylamine, triisopropylamine, butylamine, tributylamine, 1-butylamine, 2-methylbutylamine, N-methyl-N-butylamine, di-2-methylbutylamine, trihexylamine, tri-2-ethylhexylamine, dodecylamine, tridodecyl amine, tri-2-chloroethylamine, di-2-bromoethylamine, methanolamine, ethanolamine, diethanolamine, triethanolamine, N-methyldiethanolamine, N,N-dimethylethanolamine, N-methyldiethanolamine, isopropanolamine, propanolamine, diisopropanolamine, triisopropanolamine, N-butylethanolamine, dihexanolamine, 2-methoxyethylamine, di-2-ethoxyethylamine, tri-2-ethoxyethylamine, 2-hydroxyethyldiisopropylamine, 2-aminoethylethanolamine, allylamine, butenylamine, dihexadienylamine, cyclohexylamine tricyclohexylamine, trimethylcyclohexylamine, bis-methylcyclopentylamine, tricyclohexenylamine, tricyclohexadienylamine, tricyclopentadienylamine, N-methyl-N-cyclohexylamine, N-2-ethylhexyl-N-cyclohexylamine, phenyldimenthylamine, p-acetylphenyldimethylamine, p-caprylyphenyl dimethylamine, methylphenylamine, ditolylamine, p-dimethylaminophenyl acetate, p-dimethylaminophenyl valerate, triphenethylamine, benzyldimethylamine, benzyldihexlamine, ethyl dimethylaminobenzoate, heptyl dimethylaminobenzoate, trischlorophenethylenimine, N-methylethylenimine, N-cyclohexylethylenimine, piperidine, N-ethylpiperidine, 2-methylpiperidine, 1,2,3,4-tetrahydropyridine, 1,2,-dihydropyridine, 2-,3- and 4-picoline, morpholine, N-methylmorpholine, N-2-hydroxyethylmorpholine, N-2-ethoxyethylmorpholine, piperazine, N-methylpiperazine, N,N'-dimethylpiperazine, 2,2-dimethyl-1,3-bis[3-(N-morpholinyl)-propionyloxyl]propane, 1,5-bis[3-(N-morpholinyl)-propionyloxy diethyl]ether, N,N-dimethylbenzylamine, ethyldiethanolamine; triethanolamine; p-nitroaniline; n-acetyl-4-nitro-1-naphthylamine; aminoanthraquinone.

A preferred group of amines are the p-aminophenyl ketones of general formula

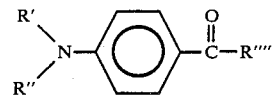

Where R' and R" are alkyl of one to 4 carbon atoms and R'''' is alkyl of one to 12 carbon atoms, alkoxy of one to 12 carbon atoms, phenyl, loweralkyliminophenylene or di(loweralkyl)aminophenylene.

Representative compounds include p-(dimethylamino)acetophenone; p-(dimethylamino)propiophenone; p-(dimethylamino)butyrophenone; p-(dimethylamino)valerophenone; p-(dimethylamino)myristylphenone; the p-(diloweralkylamino)benzoic acid esters such as p-(dimethylamino)benzoic acid ethyl ester; p-(dimethylamino)benzoic acid butyl ester; p-(dimethylamino)benzoic acid lauryl ester; p-(dimethylamino)benzoic acid myristyl ester; 4-dimethylaminobenzophenone; 4-dimethylamino-4'-propylaminobenzophenone; and 4,4'-bis(dimethylamino)benzophenone.

As indicated, the compositions of this invention are formulated with carbonylic halides. These include the aliphatic ketones, the cycloaliphatic ketones and the esters and amides of aliphatic dicarboxylic acids. The use of the above mentioned carbonylic halides leads to a marked improvement in the intensity of fluoran and free base of a dyestuff colorformers when contrasted with the effects of the prior art such as aforementioned U.S. Pat. No. 4,065,315. While all members of this class will be operative, particularly preferred results are obtained when the halogen atom is located adjacent to the carbonyl group. It may be hypothesized that the carbonyl group affects the alpha-halogen atoms in a manner analogous to the effect of the carbonyl group on the alphahydrogens; in any event the preferred carbonylic halides are those having at least one halogen atom on a carbon atom alphato a carbonyl group. Especially preferred are the carbonylic halides having two halogen atoms on an alpha-carbon atom.

One group of halogenated aliphatic ketones has from 3 to about 13 carbon atoms and from one to 4 carbonyl groups; these compounds are represented by the general formula

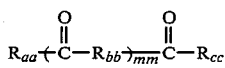

where
$R_{aa}$ is alkyl of one to eleven carbon atoms or said alkyl containing halogen atoms;
$R_{bb}$ is alkylene of one to ten carbon atoms, or said alkylene containing halogen atoms, or $R_{bb}$ represents a covalent bond;
$R_{cc}$ is alkyl or alkoxy of one to eleven carbon atoms or said alkyl or alkoxy that contains halogen atoms;
$mm$ is a number from 0 to 3.

These compounds are exemplified by:
1,1-dichloroacetone
1,1-dibromoacetone
1,3-dichloroacetone
hexabromoacetone
hexachloroacetone
pentachloroacetone
1,1,1-trichloroacetone
1,1,3,3-tetrachloroacetone
iodoacetone
1,4-dichloro-2-butanone
3,4-dibromo-2-butanone
3,3-dibromo-2-butanone
2-iodo-3-pentanone
1,3,5-trichloro-2-pentanone
4,4-dimethyl-3,3-dibromo-2-pentanone
3-iodo-2-hexanone
2,6-dimethyl-4,4-dibromo-3-heptanone
3,3-dibromo-2-heptanone
3,3-dichloro-4-heptanone
4-iodo-3-octanone
4,4-dibromo-5-nonanone
3-bromo-4-ethoxy-2,4-butanedione
1,1-dibromo-4-ethoxy-2,4-butanedione
1,4-dibromo-2,3-butanedione
1-methoxy-2-chloro-1,3-butanedione
1-methoxy-3-bromo-1,2-butanedione
3-bromo-2,4-pentanedione
3,3-dibromo-2,4,-pentanedione
1,4-dibromo-2,3-hexanedione
4,4-dibromo-2,3-hexanedione Another group of carbonylic halides is formed by the cyclic ketones containing one or two ring carboxyl groups; preferred are the carbocyclic ketones of formula

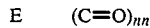

where E is the halogenated residue of a carbocyclic ketone which, together with the bound carbonyl groups contains from 4 to about 8 carbon atoms in the ring; A can be substituted, in addition to halogen, by lower alkyl, lower alkoxy or acyl of two to 6 carbon atoms; $nn$ is 1 or 2.

These compounds are illustrated by:
perchloro-2-cyclobuten-1-one
2,2,4,4-tetrabromocyclobutanone
2-chlorocyclopentanone
2,2,5,5-tetrabromocyclopentanone
2-bromo-3-acetylcyclopentanone
2-chlorocyclohexanone
2,2,6,6-tetrabromocyclohexanone
3-ethoxy-2,3-dibromocyclohexanone
3,5-dimethyl-2,3-dibromocyclohexanone
2,2-dibromo-3-acetylcyclohexanone
3,3-dichloro-2,2-dihydroxycyclohexanone
3,6-dichloro-1,2-cyclohexanedione
hexachloro-2,4-cyclohexanedione
3,6-dibromo-1,2-cyclohexanedione
3,3-dibromo-1,4-cyclohexanedione
2,3-dibromo-1,4-cyclohexanedione
2-iodo-1,3-cyclohexanedione
2-iodo-1,3-cyclopentanedione
2,2-dibromo-5,5-dimethyl-1,3-cyclohexanedione
2,2-dibromo-4,4-dimethyl-1,3-cyclohexanedione Another group of compounds useful herein are the esters and amides of formula:

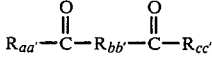

where
$R_{aa'}$ is amino that is unsubstituted or substituted by one or two of lower alkyl or halogenated lower alkyl, or $R_{aa'}$ is alkoxy or halogenated alkoxy of one to 4 carbon atoms, or $R_{aa'}$ is

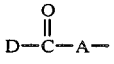

where D is alkoxy or haloalkoxy of one to 4 carbon atoms and —A— is alkylene or haloalkylene of one to 4 carbon atoms;
$R_{bb'}$ is a covalent bond, alkylene or haloalkylene of one to 4 carbon atoms or the group;

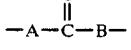

where A and B each independently is alkylene or haloalkylene of one to 4 carbon atoms;
$R_{cc'}$ is amino that is unsubstituted or substituted by one or two of lower alkyl or halogenated lower alkyl, or $R_{cc'}$ is alkoxy or haloalkoxy of one to 4 carbon atoms.

These compounds will contain up to about 12 carbon atoms and are illustrated by:
dimethyl dibromomalonate
diethyl dibromomalonate
diethyl iodomalonate
dibromomalonamide
iodomalonamide
α,α-dibromosuccinamide
diethyl α,α'-dibromosuccinate
methyl α-bromoglutarate
α-iodoglutaramide
dimethyl α,α'-dichloroglutarate
3-bromo-2-ketoglutaramide
dimethyl-3-iodo-4-ketopimaleate
diethyl-1,3-dibromo-1,3-acetonedicarboxylate
diethyl-3,6-dibromo-1,4-cyclohexanedione-2,5-dicarboxylate From the foregoing, it is apparent that in one aspect the invention relates to a phototropic photosensitive composition comprising:
a. an ethylenically unsaturated component capable of free radical initiated curing, crosslinking or polymerization;
b. a free radical generator;
c. a colorformer selected from
   (i) free bases of amino dyestuffs
   (ii) fluoran compounds;
d. an activator for the colorformer
   (i) a hydrogen donor
   (ii) a halogenated carbonylic compound.

Where the free radical generator is a combination that includes a hydrogen donor, such as benzophenone, and an amine, such as an alkylamino benzophenone, another hydrogen donor need not be added. Thus an amine, if present, can perform two functions: as a chain transfer agent and as a proton donor in connection with activation of the fluoran colorformer.

In the preferred embodiments the photosensitive phototropic composition comprises:
a. an acrylyl or methacrylyl compound
b. a photoinitiator
c. a fluoran colorformer
d.
   1. an amine
   2. a carbonylic halide selected from aliphatic ketones of 3 to 13 carbon atoms, carbocyclic keto of 4 to 8 ring carbon atoms, esters and amides of dicarboxylic acids and esters and amides of keto acids.

The particularly preferred embodiments are those where the photoinitiator is one or more of a benzoin ether, benzophenone, a derivative of benzophenone, a monoaryl ketone, a xanthone, a thioxanthone, or a quinone, the fluoran colorformer colorformer is a 2-amino fluoran and the amine is a tertiary amine and the carbonylic halide contains at least one alpha halogen.

Thus, in the particularly preferred embodiments, the compositions comprise
a. an acrylyl or methacrylyl compound
b. a benzoin ether, benzophenone, a loweralkylamino benzophenone, a monoaryl ketone, a xanthone, a thioxanthone, a quinone or mixture thereof
c. a 2-amino fluoran colorformer
d.
   1. a tertiary amine
   2. a carbonylic halide containing at least one alpha halogen, selected from halogenated aliphatic ketones of 3 to 13 carbon atoms, halogenated carboxylic ketones of 4 to 8 ring carbon atoms, esters and amides of halogenated dicarboxylic acids containing up to 12 carbon atoms and esters and amides of halogenated keto acids containing up to 12 carbon atoms.

The compositions of the present invention may be used in relatively thick layers or may be cast as thin films having thicknesses of from about 0.25 to about 5 mils or even more. When prepared in the form of an assembly comprising a support, composition and transparent sheet, i.e., dry film photoresist, the composition will generally be from 0.5 to 5 mils thick. Suitable base or support materials include metals such as steel, aluminum, and copper in the form of plates, sheets and foils; film-forming synthetic resins or high polymers such as addition polymers and copolymers of vinyl chloride, vinylidine chloride, vinyl acetate, acrylonitrile, ethylene propylene, etc.; and condensation polymers such as polyethylene terephthalate and polyamides and thermoset composites such as fiberglass-epoxy and paper-phenolic laminates.

A typical useful dry film resist will contain:

| Component | Broad Range (weight %) | Preferred Range (weight %) |
|---|---|---|
| Preformed polymer binder | 40–70% | 50–70% |
| Polymerizable, curable or crosslinkable component | 30–50% | 30–40% |
| Photoinitiator(s) | 1–10% | 1–5% |
| Fluoran Colorformer | 0.01–2% | 0.5–1.5% |
| Carbonylic halide | 0.1–5% | 0.5–2% |
| Amine | 0.1–10% | 0.2–5% |

The dry film phototropic photosensitive composition can additionally contain other conventional compounds such as thermal polymerization inhibitors, antioxidants, adhesion promoters and the like.

In use, the photopolymerizable dry film is exposed to a source of actinic radiation which may be through a halftone image or a process transparency; e.g., a process negative or positive, stencil or a mask. Exposure may also be through a continuous tone, negative or positive image. The exposure can be by the contact or projection method, with or without a cover sheet over the photopolymerizable layer or by projection using a cover sheet. These procedures are well known to those skilled in the art. The photoresist compositions are generally used in conjunction with ultraviolet light and the radiation source should furnish an effective amount of this radiation; point or broad radiation sources are effective. Such sources include carbon arcs, mercury-vapor arcs, fluorescent lamps with ultraviolet radiation emitting phosphors, argon glow lamps, electronic flash units and photographic flood lamps. Of these, the mercury arcs, particularly the sun lamps, are most suitable.

The dry film photoresist compositions after exposure can be developed in known manner, for example by impingement of spray jets, with agitated immersion, brushing or scrubbing to desirable images with an organic solvent or mixture thereof capable of washing away the unexposed portions of the resist film. Useful solvents include cellosolve acetate, ethyl acetate, methyl ethyl ketone, acetone, trichloroethylene, carbon tetrachloride, tetrachloroethylene, the alkanols of one to four carbon atoms, butyl cellosolve, chlorobenzene and dimethylformamide. Where the resist has been formulated to be developed by aqueous alkali, solutions of sodium carbonate, sodium hydroxide, trisodium phosphate and the like can be used, either alone or in admixture with each other or with one or more solvents.

The phototropic compositions are also useful in ultraviolet-curable coating and printing compositions. One advantage that attends such compositions formulated with the phototropic dye systems is that thicker coatings can be employed than was previously the case since actinic light can penetrate through to the bottom of the coating before the color of the composition has intensified. Since color can now be obtained without pigments and the like which interfere with the penetration of actinic light, thicker, more resistant coatings are obtainable.

The coating and printing compositions will generally contain from about 0.1 to about 2% of fluoran compound, from about 0.1 to about 5% of carbonylic halide from 0.1 to 10% of amine; the compositions will generally contain from about 1 to 10% by weight of photoinitiator. The balance of the compositions will be monomeric (including reactive oligomers) compounds, polymeric binders, plasticizers, adhesion promoters, antioxidants, fillers, thixotropic agents and leveling agents. Pigments can be added if desired.

These compositions can be applied by screen or other printing techniques or by brushing, roller coating, knife coating, curtain coating, etc.

The acrylyl and methacrylyl compounds, notably the acrylyl oligomers and esters, as described above, are particularly useful.

One useful class of oligomers is obtained by reacting an organic polyether or polyester polyol with a diisocyanate to provide an isocyanate-terminated prepolymer. This product can be reacted with an unsaturated alcohol, such as a hydroxy alkyl acrylate to provide, either alone or in combination with other unsaturated monomers, a material that will polymerize under the influence of free radicals to form a hard, tough, adherent film.

In a variation of the foregoing, a polymercaptoester such as trimethylolpropane-tris-(thioglycolate); trimethylolpropane tris-(mercaptopropionate); pentaerythritol tetrakis(thioglycolate); pentaerythritol tetrakis-(mercaptopropionate); and the like are reacted with a diisocyanate to provide a polythiourethane intermediate which can be reacted with an unsaturated alcohol, such as a hydroxy acrylate to provide, either alone or in combination with other unsaturated monomers, a free radical polymerizable material having excellent film properties after crosslinking.

Another illustration of a useful oligomer is an acrylate-capped polycaprolactone polyurethane, obtained by reacting a hydroxy-terminated polycaprolactone with a diisocyanate and thereafter reacting the isocyanate-terminated intermediate with an unsaturated alcohol such as a hydroxylalkyl acrylate.

Still another useful class of oligomers is obtained by reacting an epoxy resin with acrylic acid to obtain an epoxy diacrylate. For example, an epichlorohydrin/bisphenol A-type epoxy resin can be reacted with a stoichiometric amount of acrylic acid. Such products are available commercially as under the trademark "Epocryl" from Shell Chemical Company. Such materials can be combined with a variety of acrylic esters including neopentyl glycol diacrylate, hydroxyethyl acrylate and dicyclopentenyl acrylate and other unsaturated esters of polyols including such esters of methylene carboxylic acid such as, ethylene glycol diacrylate; diethylene glycol diacrylate; glycerol diacrylate; glycerol triacrylate; ethylene glycol dimethacrylate; 1,3-propylene glycol dimethacrylate; 1,2,4-butanetriol trimethacrylate; 1,4-benzenediol dimethacrylate; pentaerythritol tetramethacrylate; 1,3-propanediol diacrylate; 1,6-hexanediol diacrylate; the bis-acrylates and methacrylates of polyethylene glycols of molecular weight 200–500; trimethylolpropane triacrylate; pentaerythritol triacrylate; and other ethylenically unsaturated compounds, to polymerize under the influence of free radicals to form films of excellent adhesion and toughness.

Another composition comprises a combination of a terminally unsaturated urethane composition (polyene) and a polythiol which are polymerizable under the influence of free radicals generated by the action of actinic light on a photoinitiator.

The coating and printing ink compositions will contain a predominant amount of film-forming materials and photosensitizer and a relatively minor amount of fluoran compound halogen compound and amine. For example, a typical composition will contain from 15 to 70% by weight of an ethylenically unsaturated compound as described above, 10–50% of one or more unsaturated monomers or of a preformed polymeric binder, 0.1 to 10% by weight of a photoinitiator; 0.01 to 2% by weight of fluoran compound as described above, 0.1 to about 5% of carbonylic halide and 0.1 to 10% of amine. A more narrow range is from about 40 to about 55% by weight of ethylenically unsaturated compound, from 30–45% of monomer or of polymeric binder from 1 to 5% of initiator, from 0.5 to 1.5% of fluoran compound, from 0.5 to 2% of halogen compound and from 0.2 to 5% of amine.

The invention is further illustrated by the following examples.

Examples A through H illustrate the preparation of a variety of useful fluoran colorformers.

EXAMPLE A 2-anilino-6-diethylaminofluoran

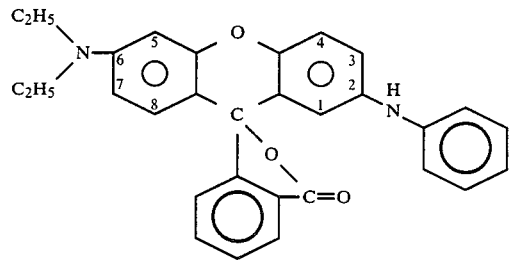

Heat together 2.2 parts by weight of 2-carboxy-4'-diethylamino-2'-hydroxybenzophenone, 1 part by weight of p-nitrophenol and 40 parts by weight of 90 weight percent H$_2$SO$_4$ for about 1 hour at 150° C. Thereafter pour the mixture into about 225 parts by weight of ice and raise the pH to about 8 by addition of dilute NH$_4$OH. Extract this solution with benzene and thereafter wash the benzene with 10 percent by weight aqueous NaOH and then with water. Purify the washed benzene extract by passage through an activated alumina chromatograph column. Concentrate the resulting solution by evaporation, add petroleum ether and recrystallize. Reduce the product with stannous chloride solution, extract with benzene and recrystallize to obtain 2-amino-6-diethylaminofluoran. Reflux 7.8 parts by weight of this product, 4 parts by weight of o- bromobenzoic acid, 2.8 parts by weight of potassium carbonate, 0.1 part by weight of copper powder and 40 parts by weight of amyl alcohol for about 3 hours. Cool and add petroleum ether to separate the crude reaction product. Heat the crude reaction product to 250°–260° C. to decarboxylate, then dissolve in benzene and wash twice with 1 weight percent aqueous sodium carbonate and once with water. Concentrate the benzene solution by evaporation and precipitate with petroleum ether. Dissolve the product in benzene, purify over activated alumina, recrystallize using petroleum ether and recover the product.

EXAMPLE B 2-(2'-methoxycarbonyl anilino)-6-diethylamino fluoran

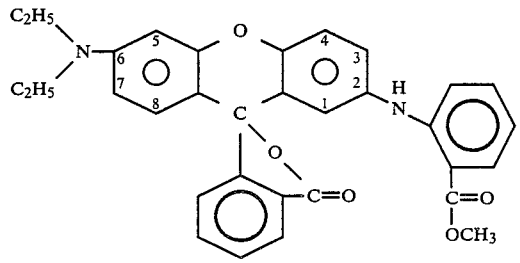

The crude reaction product of Example A is methylated by refluxing 1 part by weight of said reaction product with 0.3 parts by weight of dimethylsulfate, 0.5 parts by weight of dicyclohexylamine and 12 parts by weight of acetone for about 15 minutes. Evaporate the solvent and then heat over a steam bath for an additional 15 minutes. Extract with benzene and purify through activated alumina. Concentrate by evaporation and add petroleum ether to crystallize the reaction product.

EXAMPLE C 2-(2'-methoxycarbonyl-anilino)-3-methyl-6-diethylaminofluoran

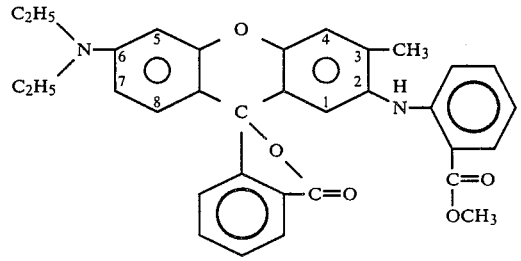

Following the procedure of Example A, but using 3-methyl-4-nitrophenol in place of p-nitrophenol, there is obtained 2-amino-3-methyl-6-diethylaminofluoran. Reacting this product with o-bromobenzoic acid in the manner described in Example A provides the carboxylic acid-containing crude reaction product. Methylating this crude reaction product according to Example B provides the desired product.

EXAMPLE D 2-anilino-3-methyl-6-diethylaminofluoran

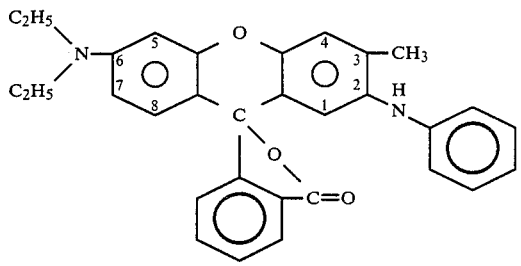

Decarboxylation of the carboxylic acid-containing crude reaction product of Example C as described in Example A, provides the desired product.

By an alternate route, one gram of 2'-carboxy-4-diethylamino-2-hydroxybenzophenone can be dissolved in a mixture of 4 ml. of concentrated sulfuric acid and an equal volume of fuming sulfuric acid at an $SO_3$ content of 20% with mechanical stirring, and externally cooled to about 15° C. Add 1.9 grams of 4-amino-3-methylphenol gradually and continue stirring over 16 hours at about 20° C. Thereafter, pour the reaction mixture into about 200 grams of ice-water, raise the pH to about 8 with a 10 percent by weight aqueous solution of NaOH and extract with benzene. Wash the benzene successively with 10% NaOH, 2% NaCl and then water. Concentrate by evaporation, purify over activated alumina, elute with a 3:3:1 mixture of benzene:ether:ethyl acetate, evaporate and recover the product.

EXAMPLE E 2-anilino-6-diethylamino-3-methoxyfluoran

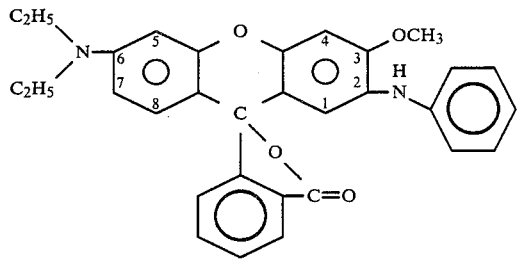

Following the alternate procedure described in Example D but using 4-amino-3-methoxyphenol instead of 4-amino-3-methylphenol, there is obtained the indicated product.

EXAMPLE F 2-(N-benzylamino)-6-N-pyrrolidinylfluoran

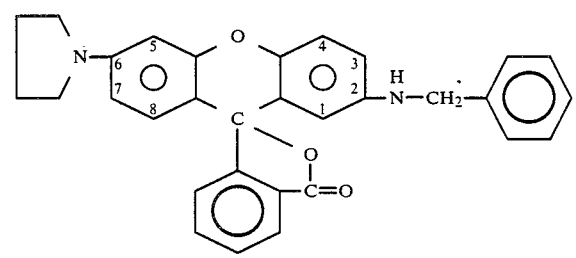

Stir a mixture of 77.75 grams of 2'-carboxy-2-hydroxy-4-N-pyrrolidinylbenzophenone 75.6 grams N-benzyl-p- anisidine and 250 ml of 98% $H_2SO_4$ at 60° C. for 5 hours and then quench into 2,750 ml. ice water. Filter the solid, wash with water and add the solid to a mixture of 500 ml. water, 250 ml. methanol and 26.8 grams NaOH at 70° C. Boil this mixture for 2 hours and cool to 85° C. Filter the solid product, wash with hot water, recrystallize from methanol/acetone and dry. The starting benzophenone compound can be prepared by heating a mixture of 74 grams phthalic anhydride 81.5 grams 1-(3'-hydroxyphenyl)pyrrolidine and 335 ml. xylene for 6 hours at 125° C. Cool to 25° C., filter the precipitate, wash with methanol and recrystallize from ethanol.

EXAMPLE G 2,6-di-(N-pyrrolidinyl)fluoran

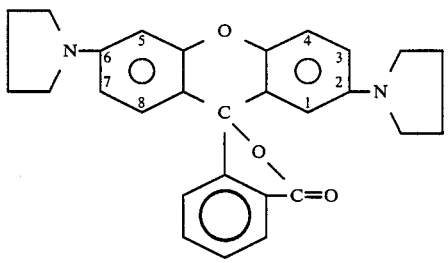

Following the procedure of Example F, but condensing the 2'-carboxy-2-hydroxy-4-N-pyrrolidinylbenzophenone with 1-(4'-hydroxyphenyl)pyrrolidine, instead of N-benzyl-p-anisidine, there is obtained the indicated product.

EXAMPLE H 2-methyl-4-amino-6-diethylaminofluoran

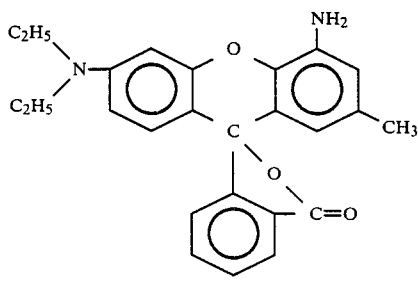

React 2'-carboxy-2-hydroxy-4-diethylamino benzophenone with 4-methyl-2-nitrophenol according to the procedure of Example A and then reduce the product by suspending one part by weight of product in a solution of 2.5 parts by weight of stannous chloride, 2 parts by weight of HCl having a specific gravity of 1.15 and about 0.6 parts by weight of water; warm and stir the suspension until a solution forms. Cool the solution to room temperature, dilute with about 2 parts by weight of water and raise the pH to about 12 with a 10 weight percent aqueous NaOH solution. Recover and purify the precipate by washing, extraction and recrystallization, as indicated in the previous examples.

EXAMPLE 1

Colorformers are evaluated with respect to phototropic capacity in the following composition:

|  | Parts by wt. |
|---|---|
| Acryloid A-101[a] | 60.3 (solids basis) |
| Trimethylolpropane triacrylate | 19.6 |
| Tetraethylene glycol diacrylate | 9.8 |
| 2-Chlorothioxanthenone | 3.4 |
| 2,2'-methylene bis (4-ethyl-6-t-butyl) phenol | .18 |
| Modaflow[b] | .15 |
| Tricresyl phosphate | 4.31 |
| 4,4'-bis (dimethylamino)benzophenone | 0.45 |
| Halide[c] | 1.51 |
| Colorformer | 0.3 |
|  | 100.0 |
| Methyl ethyl ketone | 195 |

[a]an acrylic ester polymer in organic solvent from Rohm & Haas Company.
[b]a hydrocarbon flow control agent from Monsanto Chemical Co.
[c]TBCY = 2,2,6,6-tetrabromocyclohexanone
DDB = dimethyldibromomalonate The composition is coated onto a 1-mil thick polyester film and dried in air. The dry thickness of the photosensitive composition is 1–2 mils. The dried layer is covered with a 1-mil thick polyethylene film.

The phototropic capacity is determined visually by removing the polyethylene film, laminating the photopolymerzable composition to a copper-clad panel, placing a light mask over the assembly and exposing this combination to a mercury vapor lamp for 30 seconds. The image is read immediately. Zero means no image, a negative rating indicates the dye system is photofugitive (i.e., fades) while a positive rating indicates the system has darkened in response to the light and is phototropic.

Fluoran compound, color and phototropic capacity are indicated below:

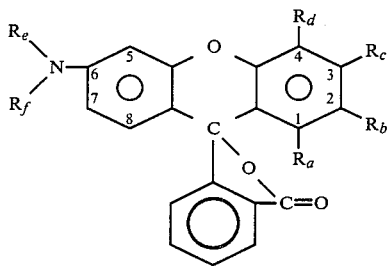

| $R_a$ | $R_b$ | $R_c$ | $R_d$ | $R_e$ | $R_f$ | Developed Color | Phototropic Capacity TBCY | DDB |
|---|---|---|---|---|---|---|---|---|
| H | −N(CH$_3$)(CH$_2$COC$_2$H$_5$) | H | H | C$_2$H$_5$ | C$_2$H$_5$ | Green | + | + |
| H | −NH−C$_6$H$_3$(NH$_2$)(CH$_3$) | CH$_3$ | H | C$_2$H$_5$ | C$_2$H$_5$ | Purple-Black | + | + |
| H | −NH−C$_6$H$_4$−NH$_2$ | H | H | C$_2$H$_5$ | C$_2$H$_5$ | Black | + | + |
| H | −N(CH$_2$C$_6$H$_5$)$_2$ | H | H | C$_2$H$_5$ | C$_2$H$_5$ | Dark Green | + | + |
| H | −NH−C$_6$H$_5$ | H | H | C$_2$H$_5$ | C$_2$H$_5$ | Black | + | + |
| H | −N(piperidino) | H | H | C$_2$H$_5$ | C$_2$H$_5$ | Green | + | + |
| H | −NH−C$_6$H$_4$−COOCH$_3$ | H | H | C$_2$H$_5$ | C$_2$H$_5$ | Black | + | + |
| H | −NH−C$_6$H$_5$ | CH$_3$ | H | C$_2$H$_5$ | C$_2$H$_5$ | Black | + | + |

-continued

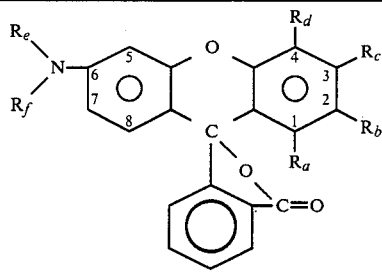

| $R_a$ | $R_b$ | $R_c$ | $R_d$ | $R_e$ | $R_f$ | Developed Color | Phototropic Capacity TBCY | DDB |
|---|---|---|---|---|---|---|---|---|
| H | N(CH₂-Ph)₂ | H | H | ' | piperidino | Green | + | + |
| H | CH₃ | H | NH₂ | C₂H₅ | C₂H₅ | Orange | + | + |
| H | —NH₂ | CH₃ | H | C₂H₅ | C₂H₅ | Purple | + | + |
| H | —NH-Ph | OCH₃ | H | C₂H₅ | C₂H₅ | Black | + | + |
| H | Cl | CH₃ | H | C₂H₅ | C₂H₅ | Red | + | + |
| H | H | Cl | H | H | cyclohexyl-H | Yellow-Orange | + | + |
| H | phenyl | H | H | C₂H₅ | C₂H₅ | Pink | + | + |
| H | p-N(C₂H₅)₂-phenyl | H | H | C₂H₅ | C₂H₅ | Blue | + | + |
| H | piperidino | H | H | H | piperidino | Green | + | + |
| H | —N(Ph) | H | H | H | piperidino | Black | + | + |
| H | —N—CH₃ | H | H | C₂H₅ | C₂H₅ | Red | + | + |

Dye base, color and phototropic capacity are indicated below:

| | | | |
|---|---|---|---|
| Rhodamine B Base | red | + | + |
| Malachite Green Base | blue-green | + | + |
| C.I. Solvent Blue 2 | red-blue | + | + |
| C.I. Solvent Blue 5 | red-blue | + | + |
| C.I. Solvent Red 49 | red-violet | + | + |
| C.I. Solvent Violet 10 | red-violet | + | + |
| C.I. 42510B | red-violet | + | + |
| C.I. 42535B | blue-violet | + | + |
| C.I. 42600 | blue-violet | + | + |

| | | | |
|---|---|---|---|
| -continued | | | |
| C.I. 44520 | violet | + | + |
| C.I. 45006 | red | + | + |
| C.I. 45015 | red | + | + |
| C.I. 46025 | yellow | + | + |
| C.I. 46055 | orange | + | + |
| C.I. 48013 | red-violet | + | + |

EXAMPLE 2

A photoresist composition useful to evaluate various combinations of colorformers and carbonylic halides is prepared from the following ingredients:

| | Parts by wt. |
|---|---|
| poly(methyl methacrylate)[1] | 60.0 |
| pentaerythritol triacrylate | 32.0 |
| benzophenone | 3.2 |
| 2,2'methylene-bis-(4-ethyl-6-t-butylphenol) | .9 |
| Colorformer | .9 |
| Carbonylic halide | 2.2 |
| 4,4'-bis(dimethylamino)benzophenone | .8 |
| methyl ethyl ketone | 150.0 |

[1] a medium molecular weight product available from E. I. duPont de Nemours & Co., Inc., Wilmington, Delaware under the trademark Elvacite 2010.

The composition is made by dissolving the methyl methacrylate polymer in the solvent, using conventional equipment at low to medium speeds, then adding the monomer and then adding the remaining ingredients.

The solution is coated onto a 1 mil thick polyester film and dried in air. The dry thickness of the sensitized layer is 1–2 mils. The dried layer is covered with a 1 mil thick polyethylene film.

The following table indicates the phototropic capacity of six representative colorformers in the presence of a variety of carbonylic halides; phototropic capacity is determined as described in Example 1.

A = 2-anilino-3-methoxy-6-diethylaminofluoran
B = 2-anilino-6-diethylaminofluoran
C = 2-piperidino-6-diethylaminofluoran
D = 2-(N,N-dibenzylamino)-6-pyrrolidinofluoran
E = Rhoadamine B Base
F = Malachite Green Base

| Halogenated Compound | A | B | C | D | E | F |
|---|---|---|---|---|---|---|
| hexabromoacetone | + | + | + | + | + | + |
| 3,4-diiodo-2-butanone | + | + | + | + | + | + |
| 3,3-dibromo-2-butanone | + | + | + | + | + | + |
| 3,3-dibromo-2-heptanone | + | + | + | + | + | + |
| 1,1-dibromo-4-ethoxy-2,4-butanedione | + | + | + | + | + | + |
| 1,4-diiodo-2,3-butanedione | + | + | + | + | + | + |
| 4,4-dibromo-2,3-hexanedione | + | + | + | + | + | + |
| 3,3-dibromo-2,4-hexanedione | + | + | + | + | + | + |
| perchloro-2-cyclobuten-1-one | + | + | + | + | + | + |
| 2,2,6,6-tetrabromocyclohexanone | + | + | + | + | + | + |
| 3,6-diiodo-1,2-cyclohexanedione | + | + | + | + | + | + |
| hexachloro-2,4-cyclohexanedione | + | + | + | + | + | + |
| 2-iodo-1,3-cyclohexanedione | + | + | + | + | + | + |
| 2,2-dibromo-5,5-dimethyl-1,3-cyclohexanedione | + | + | + | + | + | + |
| dibromomalonamide | + | + | + | + | + | + |
| iodomalonamide | + | + | + | + | + | + |
| dimethyl dibromomalonate | + | + | + | + | + | + |
| diethyl iodomalonate | + | + | + | + | + | + |
| 3-iodo-2-ketoglutaramide | + | + | + | + | + | + |
| dimethyl 3-iodo-4-ketopimaleate | + | + | + | + | + | + |
| diethyl-1,3-diiodo-1,3-acetonedicarboxylate | + | + | + | + | + | + |
| diethyl-3,6-diiodo-1,4-cyclohexanedione-2,5-dicarboxylate | + | + | + | + | + | + |

EXAMPLE 3

When the procedure of Example is repeated using color-formers A, B, C, D, E and F and dimethyl dibromomalonate, dibromomalonamide, diethyl-1,3-dibromo-1,3-acetone dicarboxylate and tetrabromocyclohexanone as the carbonylic halide with a variety of amines as hydrogen donors, the systems display phototropic capacity:

| Carbonylic Halide | I | | | | | | II | | | | | | III | | | | | | IV | | | | | |
|---|---|---|---|---|---|---|---|---|---|---|---|---|---|---|---|---|---|---|---|---|---|---|---|---|
| Colorformer | A | B | C | D | E | F | A | B | C | D | E | F | A | B | C | D | E | F | A | B | C | D | E | F |
| propylamine | + | + | + | + | + | + | + | + | + | + | + | + | + | + | + | + | + | + | + | + | + | + | + | + |
| diisopropanolamine | + | + | + | + | + | + | + | + | + | + | + | + | + | + | + | + | + | + | + | + | + | + | + | + |
| triethylamine | + | + | + | + | + | + | + | + | + | + | + | + | + | + | + | + | + | + | + | + | + | + | + | + |
| dimethylethanolamine | + | + | + | + | + | + | + | + | + | + | + | + | + | + | + | + | + | + | + | + | + | + | + | + |
| N,N—dimethyl butylamine | + | + | + | + | + | + | + | + | + | + | + | + | + | + | + | + | + | + | + | + | + | + | + | + |
| p-acetylphenyl dimethylamine | + | + | + | + | + | + | + | + | + | + | + | + | + | + | + | + | + | + | + | + | + | + | + | + |
| p-caprylphenyl dimethylamine | + | + | + | + | + | + | + | + | + | + | + | + | + | + | + | + | + | + | + | + | + | + | + | + |
| p-dimethylaminophenyl acetate | + | + | + | + | + | + | + | + | + | + | + | + | + | + | + | + | + | + | + | + | + | + | + | + |
| p-dimethylaminophenyl valerate | + | + | + | + | + | + | + | + | + | + | + | + | + | + | + | + | + | + | + | + | + | + | + | + |
| ethyl dimethylaminobenzoate | + | + | + | + | + | + | + | + | + | + | + | + | + | + | + | + | + | + | + | + | + | + | + | + |
| amyl dimethylaminobenzoate | + | + | + | + | + | + | + | + | + | + | + | + | + | + | + | + | + | + | + | + | + | + | + | + |
| p-dimethylamino acetophenone | + | + | + | + | + | + | + | + | + | + | + | + | + | + | + | + | + | + | + | + | + | + | + | + |
| 4-dimethylamino benzophenone | + | + | + | + | + | + | + | + | + | + | + | + | + | + | + | + | + | + | + | + | + | + | + | + |
| 4,4'-bis-(dimethylamino)-benzophenone | + | + | + | + | + | + | + | + | + | + | + | + | + | + | + | + | + | + | + | + | + | + | + | + |

I = dimethyl dibromomalonate
II = dibromomalonamide
III = diethyl-1,3-dibromo-1,3-acetonedicarboxylate
IV = tetrabromocyclohexanone

EXAMPLE 4

Combinations of photoinitiators and amines can be evaluated using the following composition and the procedures described in Examples 2 and 3.

| | Parts by wt. |
|---|---|
| poly (methyl methacrylate)[1] | 60.0 |
| pentaerythritol triacrylate | 30.0 |
| photoinitiator | 3.2 |
| 2,2'-methylene-bis-(4-ethyl-6-t-butylphenol) | .9 |
| colorformer | .9 |
| 2,2,6,6-tetrabromocyclohexanone | 2.2 |

| | Parts by wt. |
|---|---|
| amine | 2.8 |
| methyl ethyl ketone | 150.0 |

(1)Elvacite 2010 from Du Pont.

The following table indicates phototropic capacity of representative colorformers A and B of Example 2 with a variety of photoinitiators and amines.

| | Photoinitiator |
|---|---|
| 1 | thioxanthone |
| 2 | 2-chlorothioxanthone |
| 3 | fluroenone |
| 4 | benzil |

| Photoinitiator | 1 | | 2 | | 3 | | 4 | |
|---|---|---|---|---|---|---|---|---|
| Colorformer | A | B | A | B | A | B | A | B |
| dimethylethylanolamine | ++ | ++ | ++ | ++ | ++ | ++ | ++ | ++ |
| N,N—dimethyl butylamine | ++ | ++ | ++ | ++ | ++ | ++ | ++ | ++ |
| p-acetylphenyl dimethylamine | ++ | ++ | ++ | ++ | ++ | ++ | ++ | ++ |
| p-caprylylphenyl dimethylamine | ++ | ++ | ++ | ++ | ++ | ++ | ++ | ++ |
| p-dimethylaminophenyl acetate | ++ | ++ | ++ | ++ | ++ | ++ | ++ | ++ |
| p-dimethylaminophenyl valerate | ++ | ++ | ++ | ++ | ++ | ++ | ++ | ++ |
| ethyl dimethylamino benzoate | ++ | ++ | ++ | ++ | ++ | ++ | ++ | ++ |
| amyl dimethylamino benzoate | ++ | ++ | ++ | ++ | ++ | ++ | ++ | ++ |
| p-dimethylamino acetophenone | ++ | ++ | ++ | ++ | ++ | ++ | ++ | ++ |
| 4-dimethylamino benzophenone | ++ | ++ | ++ | ++ | ++ | ++ | ++ | ++ |
| 4,4'-bis (dimethylamino) benzophenone | ++ | ++ | ++ | ++ | ++ | ++ | ++ | ++ |

EXAMPLE 5

The following solution is coated onto a 1 mil thick polyester film to provide a dry thickness of about 0.001 inch, and dried in air. The dried film is covered with a 1 mil thick polyethylene film.

| Ingredients | Parts by wt. |
|---|---|
| copolymer of 75% styrene and 25% methacrylic acid; viscosity of a 40% solution in MEK is 10,360 cps | 57.0 |
| trimethylolpropane triacrylate | 24.0 |
| tetraethyleneglycol diacrylate | 12.2 |
| benzophenone | 4.0 |
| 4,4'-bis-(dimethylamino)-benzophenone | 0.6 |
| 2-anilino-3-methoxy-6-diethylaminofluoran | 0.3 |
| diethyliodomalonate | 1.5 |
| benzotriazole | .4 |
| methyl ethyl ketone | 160.0 |

A piece of copper clad, epoxy-fiberglass board is cleaned by scouring with an abrasive cleaner, swabbing and thoroughly rinsing in water. It is given a 20 second dip in dilute hydrochloric acid solution (2 volumes water plus 1 volume concentrated hydrochloric acid), a second rinse with water and then dried with air jets.

The polyethylene cover film is removed from a section of the sandwiched photoresist dry film described above. The bared resist coating with its polyester support is laminated to the clean copper with the surface of the photoresist in contact with the copper surface. The lamination is carried out with the aid of rubber covered rollers operating at 250° F.(121° C.) with a pressure of 3 pounds per lineal inch at the nip at a rate of 2 feet per minute. The resulting sensitized copper clad board protected as it is by the polyester film can be held for later use if desired. Exposure to light is had through a high contrast transparency image in which the conducting pattern appears as transparent areas on an opaque background. Exposure is carried out by placing the sensitized copper clad board (with polyester film still intact) and the transparency into a photographic printing frame. Exposure is maintained for a period of 90 second to a 400 watt, 50 ampere vapor lamp at a distance of 12 inches. It is seen that the areas of the resist that have been exposed to light have darkened in color considerably, to a black color which contrasts substantially with the unexposed portions of the resist. The polyethylene terephthalate support film is peeled off and the exposed resist layer developed by agitating the board in a tray containing 2% trisodium phosphate in water for 2 minutes followed by a water rinse. The resulting board which contained a deeply colored resist pattern of the clear areas of the exposing transparency is then etched in ferric chloride solution, rinsed and dried. The resist is removed from the remaining copper by dipping for 2 minutes in a 3% solution of sodium hydroxide in water at 70° C. The result is a high quality printed circuit board.

In an alternative embodiment, the surface of the exposed copper obtained after developing is further cleaned by dipping the board into a 20% ammonium persulfate bath for 30 seconds, washing copiously with water, dipping for 30 seconds in a 20% solution of hydrochloric acid in water, rinsing with water, then drying the board with jets of air. This cleaned board is then plated for 45 minutes at 30 amperes per square foot in a copper pyrophosphate plating bath at 55° C.

EXAMPLE 6

A copper clad piece of epoxy-fiberglass board is cleaned as described in Example 5 above. The cleaned, dried board was sensitized by flowing the following solution over the surface of the board:

| Ingredients | Parts by wt. |
|---|---|
| Copolymer of 37% styrene and 63% monobutyl maleate, average mol. wt. 20,000, viscosity of 10% aqueous solution of ammonium salt = 150 cps. | 60.0 |
| Pentaerythritol tetraacrylate | 34.2 |
| Benzophenone | 2.5 |
| 4,4'-bis-(dimethylamino)-benzophenone | 0.3 |
| Benzotriazole | 0.2 |
| 2,2'-methylene-bis-(4-ethyl-6-tert-butylphenol) | 0.9 |
| 2-anilino-3-methoxy-6-diethylaminofluoran | 0.4 |
| 2,2,6,6-tetrabromocyclohexanone | 1.5 |
| Methyl Ethyl Ketone | 150.0 |

The excess solution is drained off the board at room temperature for 2 minutes. The coating is further dried by heating in a forced air oven at 60° C. for 5 minutes.

After cooling, the coated board is exposed as described in Example 5 above, and it is seen that where the board is exposed to light, a dark color that dramatically contrasts with the unexposed portions is visible. The resist is developed by agitating the board in a solution of 2% trisodium phosphate in water for one minute, followed by a water rinse. The board is etched in ferric chloride as described in Example 5, and after etching, the exposed resist is stripped from the protected copper by immersing the board in a 3% solution of sodium hydroxide in water at 50° C. for 2 minutes. The result is a high quality printed circuit board.

EXAMPLE 7

Coating compositions are prepared from the following amounts of components:

| Components | Composition, Parts by Wt. | | | | |
|---|---|---|---|---|---|
| | I | II | III | IV | V |
| PCP[a] | 36.2 | — | — | — | — |
| EPOA[b] | 4.8 | 4.5 | — | — | — |
| E.D.[c] | 16.2 | 57.0 | 54.5 | 59.5 | 47.6 |
| NPGDA[d] | 14.2 | 18.1 | 17.3 | 19.0 | 19.0 |
| EHA[e] | 14.2 | 9.0 | 8.7 | 9.5 | 9.5 |
| DCPA[f] | 9.6 | 6.9 | 15.2 | 7.2 | 19.0 |
| Benzophenone | 4.8 | 4.5 | 4.3 | 4.8 | 4.9 |
| Colorformer[g] | 0.9 | 0.9 | 0.9 | 0.9[h] | 0.9[i] |
| Dibromomalonamide | 1.5 | 1.5 | 1.5 | 1.5 | 1.5 |
| 4,4'-bis(dimethylamino) benzophenone | .5 | .5 | .5 | .5 | .5 |

[a] 80% solution of Union Carbide PCP-0300 polycaprolactone/toluene diisocyanate oligomer in 20% hydroxyethyl acrylate
[b] polyacrylate of epoxidized soya bean oil available from Union Carbide
[c] Epocryl (epoxy diacrylate)
[d] neopentyl glycol diacrylate
[e] 2-ethylhexyl acrylate
[f] dicyclopentenyl acrylate
[g] 2-anilino-3-methoxy-6-diethylaminofluoran
[h] 2-anilino-6-diethylaminofluoran
[i] 2-piperidine-6-diethylaminofluoran The compositions are prepared by combining the monomers and mixing in conventional equipment at low to medium speeds until dissolved. The photoinitiator is added and the other ingredients are incorporated.

The coatings are applied to a cellulosic substrate (hardboard) by direct roller coating. The wet coated substrate is then exposed to UV radiation by being placed on a chain link conveyor and passed under a 200 watt/lineal inch Hanovia quartz ultraviolet lamp at a distance of about two inches at a speed of approximately 12 feet per minute.

Tough, resistant, deeply colored coatings are obtained.

EXAMPLE 8

An ink composition is prepared as follows by mixing together the following components in conventional manner.

| | |
|---|---|
| Epoxy Acrylate | 60.0 |
| Ultraflex Microcrystalline Wax | 3.3 |
| Pentaerythritol Tetraacrylate | 29.2 |
| Benzophenone | 4.5 |
| 4,4'-bis (dimethylamino)benzophenone | .50 |
| 2-anilino-3-methoxy-6-diethylaminofluoran | 1.0 |
| Dibromomalonamide | 1.50 |

When this ink is silk screened onto a paper substrate and exposed to light using a 200 watt/linear inch medium pressure mercury vapor lamp at a distance of 4 inches for about 5 seconds, there is obtained a dry, tack-free dark-printed substrate having good gloss and adhesion.

When the colorformer is replaced by the colorformers described in Example 1, there is obtained an ink that cures to a dry, tack-free, deeply colored product.

EXAMPLE 9

An acrylated urethane modified polyester can be prepared as follows:

To a reaction vessel equipped with stirrer, reflux condenser, thermometer and heating means charge

| | Parts by weight |
|---|---|
| 1,3-butylene glycol | 12.68 |
| 1,6-hexanediol | 66.64 |
| Adipic acid | 20.58 |
| Dibutyl Tin Oxide | .10 | using a nitrogen sparge. Heat to a reflux and react to an acid value less than 3. The product will have an equivalent weight of about 501 and a molecular weight of about 1000.

To a reaction vessel equipped with a stirrer, thermometer and nitrogen sparge charge 15.22 parts by weight of 2,4-tolylene diisocyanate and heat to 50° C. Add a mixture of 10.13 parts by weight of 2-ethylhexyl acrylate and 0.0035 parts by weight of phenothiazine over a two hour period, maintaining the temperature at 60° C. during this period. Hold at 60° C. for an additional three hours. Cool to 50° C. and add 43.83 parts by weight of the polyester previously prepared over a one hour period, maintaining the temperature at 60° C.; thereafter hold the temperature at 70° C. for 3 hours. Cool to 60° C.; add 0.35 parts by weight of methanol to obtain zero free isocyanate and hold an additional ½ hour at 60° C. Cool and store the product.

A. A UV curable composition can be prepared having the following composition:

| | Parts by weight |
|---|---|
| Acrylated polyester | 66.6 |
| 1,6-hexanediol diacrylate | 14.5 |
| Pentaerythritol triacrylate | 4.6 |
| Methyl ethyl ketone | 1.9 |
| 2-ethylhexyl acrylate | 4.7 |
| Dibromomalonamide | 2.0 |
| 2-Chlorothioxanthenone | 3.0 |
| 2-anilino-3-methoxy-6-diethylaminofluoran | .7 |
| dimethylamino ethanol | 2.0 |

The composition is mixed until homogeneous. The photopolymerizable composition is applied to a wooden test piece, having a smooth surface, at the rate of 100 grams per square meter and the coated surface is covered with a 30 mm. thick untreated polyethylene film exercising care to ensure that no air bubbles are entrained. This is then exposed to actinic rays with a 2-KW high pressure mercury-vapor lamp for 30 seconds at a radiation distance of 30 mm. When the polyethylene film is stripped, it is seen that a smooth cured coating is obtained having good hardness, good adhesion to the wood and that is black in color.

B. A second UV-curable system can be prepared having the following composition:

| | Parts by Weight |
|---|---|
| Acrylated polyester | 65.3 |
| Pentaerythritol tetrakis (β-mercaptopropionate) | 26.0 |
| Benzophenone | 3.0 |
| 2-anilino-3-methoxy-6-diethylaminofluoran | .7 |
| 4,4'-bis(dimethylamino) benzophenone | 3.0 |
| Dibromomalonamide | 2.0 |

When coated on a wood test specimen and treated as in part A above, there is obtained a cured coating having a black color.

What is claimed is:

1. A phototropic photosensitive composition which comprises:
   A. at least one compound which contains at least one polymerizable ethylenically unsaturated group of the structure

capable of curing, cross linking or polymerizing under the influence of free radicals,
   B. a free radical producing photo initiator for said compound that is potentiated by actinic radiation,
   C. a fluoran compound colorformer capable of becoming more intensely colored upon contact with a color activator, and
   D. a latent activator, present in an effective amount to activate the colorformer under the influence of actinic radiation, comprising a proton donor and a halogenated diamide of a dicarboxylic acid, in which the said halogenated diamide of a dicarboxylic acid has the formula

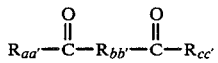

where $R_{aa'}$ is amino that is unsubstituted or substituted by one or two of lower alkyl or halogenated lower alkyl; $R_{bb'}$ is a covalent bond, alkylene or haloalkylene of one to 4 carbon atoms or the group

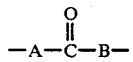

wherein A and B each independently is alkylene or haloalkylene of one to 4 carbon atoms; and $R_{cc'}$ is amino that is unsubstituted or substituted by one or two of lower alkyl or halogenated lower alkyl; and wherein at least one of $R_{aa'}$, $R_{bb'}$, and $R_{cc'}$ is halogenated.

2. A composition according to claim 1 in which the compound capable of curing, crosslinking or polymerizing is an acrylyl or methacrylyl compound.

3. A composition according to claim 2 in which the acrylyl or methacrylyl compound has the general formula

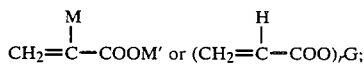

when the compound has the formula

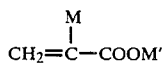

M is H or CH$_3$
   M' is cycloalkyl of 5 to 12 carbon atoms, cycloalkenyl of 5 to 12 atoms, $-C_pH_{2p}M''$ or
   ti $(C_qH_{2q}O)_sC_qH_{2q+1}$;

where
   p is an integer from 1 to 10
   q is an integer from 2 to 4
   s is an integer from 0 to 4
   M'' is hydrogen, hydroxyl, phenoxy, alkoxy or 1 to 8 carbon atoms; and where the compound has the formula

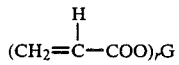

G is a polyvalent alkylene group of formula

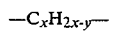

in which x is an integer from 2 to 8
   y is an integer from 0 to 2 or G is a divalent ether or ester group of formula

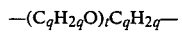

or

where
   t is an integer from 1 to 5,
   q is an integer from 2 to 4
   and r is the valence of G and is an integer from 2 to 4.

4. A composition according to claim 2 in which the acrylyl compound comprises triethyleneglycol diacrylate, tetraethylene glycol diacrylate, pentaerythritol triacrylate, trimethylolpropane triacrylate and pentaerythritol tetraacrylate as a component capable of curing crosslinking or polymerizing.

5. A composition according to claim 1 in which the photoinitiator as the component B is an aromatic carbonyl compound.

6. A composition according to claim 1 in which the photoinitiator as the component B is a benzoin ether, benzophenone, an alkylamino benzophenone, a monoaryl ketone, a xanthone, a thioxanthone, or a quinone.

7. A composition according to claim 1 in which the fluoran compound as the component C has the structural formula

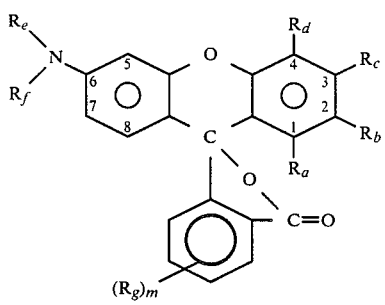

where
$R_a$ is hydrogen or an aliphatic group of one to 12 carbon atoms that is unsubstituted or optionally substituted and that may be interrupted by

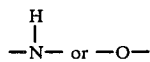

and that is bound directly via carbon or oxygen;

$R_b$ is an amino group where one or both hydrogen atoms are optionally replaced by unsubstituted or substituted aliphatic groups, cycloaliphatic groups, aromatic groups or mixed aliphatic-aromatic groups or $R_b$ is a heterocyclic group of 3 to 12 ring members bound via a ring nitrogen and containing in addition to nitrogen, one or more of oxygen and sulfur as hetero ring members or $R_a$ and $R_b$ together form a condensed aromatic nucleus;

$R_c$ is hydrogen, halogen, an aliphatic group of one to 12 carbon atoms that is unsubstituted or substituted and that may be interrupted by nitrogen or oxygen and that is bound directly via carbon or oxygen, or $R_c$ is an amino group where one or both hydrogen atoms are optionally replaced by unsubstituted or substituted aliphatic groups, cycloaliphatic groups, aromatic groups, mixed aliphatic-aromatic groups or where $R_c$ is a heterocyclic group with three to twelve ring members containing one or more of nitrogen, oxygen and sulfur as hetero ring members or $R_c$ is an aromatic group that is unsubstituted or optionally substituted or a mixed aliphatic-aromatic group or an aromatic ether or aliphatic-aromatic ether group;

$R_d$ is hydrogen, lower aliphatic or an amino group where one or both hydrogen atoms are optionally replaced by unsubstituted or substituted aliphatic groups, cycloaliphatic groups, aromatic groups, mixed aliphatic-aromatic groups or $R_d$ is a heterocyclic group of 3 to 12 ring members containing one or more of nitrogen, oxygen and sulfur as hetero ring members;

$R_e$ and $R_f$ each independently is hydrogen, unsubstituted or substituted aliphatic of one to 12 carbon atoms which may be interrupted by oxygen or nitrogen, and which is be bound directly via carbon, cycloaliphatic groups, aromatic groups, mixed aliphatic-aromatic groups, or $R_e$ and $R_f$ together with the nitrogen atom form a heterocyclic group of 3 to 12 ring members, optionally containing, in addition to nitrogen, one or more of sulfur and oxygen as hetero ring members;

$(R_g)_m$ represents one to 3, independently, of hydrogen, lower aliphatic bound directly via carbon or oxygen, or is halogen, acetamido or optionally substituted amino and provided that at least one of $R_b$, $R_c$ and $R_d$ is an amino group, as defined.

8. A composition according to claim 1 in which the fluoran compound as the component C is a 2-amino fluoran.

9. A composition according to claim 1 in which the fluoran compound as the component C is a 2-amino fluoran of the formula:

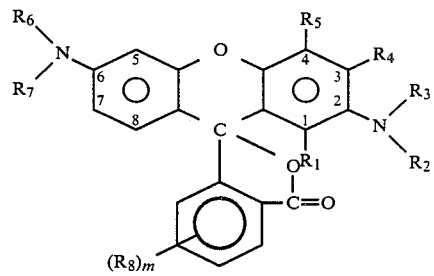

where $R_1$ is hydrogen, halogen, alkyl of one to 12 carbon atoms, alkoxy of one to 12 carbon atoms $R_2$ and $R_3$ each independently is hydrogen, alkyl of one to 12 carbon atoms, alkenyl of 2 to 12 carbon atoms alkoxyalkyl of 2 to 8 carbon atoms, alkoxycarbonylalkyl of 3 to 9 carbon atoms, cycloalkyl of 5 or 6 carbon atoms, acyl of one to 12 carbon atoms, phenyl, naphthyl or benzyl that are unsubstituted or substituted in the aromatic nucleus by one to 3 of amino, mono- or di-alkyl amino of one to 5 carbon atoms, alkyl of one to 7 carbon atoms, alkoxy of one to 7 carbon atoms, carboxyl, alkoxycarbonyl of 2 to 7 carbon atoms, acyl or acylamino of one to 5 carbon atoms, or $MeSO_3-$ where Me is alkali metal or $R_2$ and $R_3$ together with the associated nitrogen atom form a heterocyclic radical of 3 to 12 ring members selected from pyrrolidinyl, piperidyl, pipecolinyl, perhydroazepinyl, heptamethyleneimino, octamethyleneimino, indolinyl, 1,2,3,4-tetrahydroquinolinyl, hexahydrocarbazolyl, morpholinyl, thiomorpholinyl, piperazinyl, N-alkylpiperazinyl where the alkyl group contains one to 4 carbon atoms, pyrazolinyl, or 3-methylpyrazolinyl $R_4$ is hydrogen, alkyl of one to 12 carbon atoms, alkoxy of one to 12 carbon atoms, halogen, amino that is unsubstituted or substituted by one or two of the substituents as defined for $R_2$ and $R_3$, or $R_4$ is phenyl, phenoxy, benzyl or benzyloxy that is unsubstituted or substituted in the aromatic nucleus by one to 3 of amino, mono- or di-alkyl amino of one to 5 carbon atoms, lower alkyl, lower alkoxy, carboxyl, alkoxycarbonyl of 2 to 7 carbon atoms, acyl of one to 5 carbon atoms or $MeSO_3$—where Me is alkali metal $R_5$ is hydrogen, lower alkyl, lower alkoxy or amino that is unsubstituted or substituted by one or two of the substituents as defined for $R_2$ and $R_3$, including the heterocyclic members, $R_6$ and $R_7$, each independently is selected from the same group as defined for $R_2$ and $R_3$, including the heterocyclic members thereof;

$(R_8)_m$ represents one to 3 members independently selected from hydrogen, alkyl of one to 7 carbon atoms, alkoxy of one to 7 carbon atoms, halogen, acetamido, amino or mono- or di-alkyl amino of one to 7 carbon atoms.

10. A composition according to claim 1 in which the fluoran compound as the component C is a 2,6-diamino fluoran.

11. A composition according to claim 9 in which the fluoran compound is a 2,6-diamino fluoran of formula:

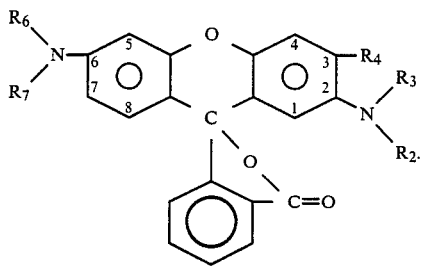

12. A composition according to claim 11 in which $R_2$ is hydrogen, alkyl of one to 7 carbon atoms or acyl of one to 7 carbon atoms $R_3$ is hydrogen, alkyl of one to 7 carbon atoms, acyl of one to 7 carbon atoms, phenyl, benzyl or napthyl or where $R_2$ and $R_3$ together with the associated nitrogen atom form morpholinyl, piperazinyl, pyrrolidinyl or piperidinyl $R_4$ is hydrogen, alkyl of one to 7 carbon atoms or alkoxy of one to 7 carbon atoms $R_6$ and $R_7$ is each alkyl of one to 5 carbon atoms or together with the associated nitrogen form morpholinyl, piperazinyl, pyrrolidinyl or piperidinyl.

13. A composition according to claim 1 in which the fluoran compound as the component C has the formula:

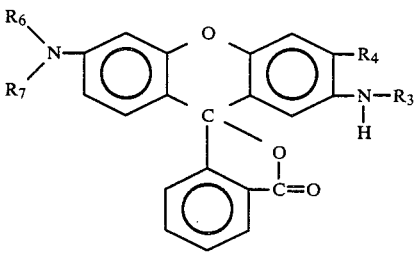

where $R_3$ is hydrogen or phenyl $R_4$ is hydrogen, $(C_1-C_3)$ alkyl or $(C_1-C_3)$ alkoxy and $R_6$ and $R_7$ is each $(C_1-C_3)$ alkyl.

14. A composition according to claim 1 in which the fluoran compound as the component C has the following formula

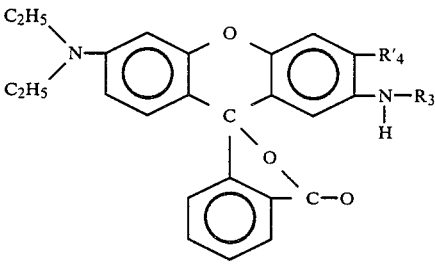

where $R_3$ is hydrogen or phenyl and $R_4$ is hydrogen, methyl or methoxy.

15. A composition according to claim 1 in which the proton donor of component D is a compound of the formula

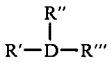

where

D is N, As or P R' and R", each independently is hydrogen, linear or branched alkyl of from 1 to about 12 carbon atoms, linear or branched alkenyl of from 2 to about 12 carbon atoms, cycloalkyl of from 3 to about 10 ring carbon atoms, cycloalkenyl of from 3 to about 10 ring carbon atoms, aryl of from 6 to 12 ring carbon atoms, alkaryl of from 6 to about 12 ring carbon atoms, aralkyl of from 6 to 12 ring carbon atoms, R''' has the same meaning as R' and R" except that it cannot be hydrogen and cannot be aryl when both R' and R" are aryl; the aryl groups can be unsubstituted or substituted by one or more of amino, mono- or di-(lower alkyl)amino loweralkylcarbonyl, loweralkoxycarbonyl, loweralkylcarbonyloxy, phenylcarbonyl or aminophenylenecarbonyl where the amino group is unsubstituted or substituted by lower alkyl, or where R' and R''' together with D form a heterocycle and in such case R" and R''' together are divalent alkylene of 2 to 12 carbon atoms, divalent alkenylene of 3 to 12 carbon atoms, divalent alkatrienylene of from 5 to 10 carbon atoms, divalent alkyleneoxyalkylene having a total of from 4 to 12 carbon atoms or divalent alkyleneaminoalkylene having a total of from 4 to 12 carbon atoms.

16. A composition according to claim 15 where D is nitrogen.

17. A composition according to claim 15 in which the proton donor of component D is a p-aminophenyl carbonyl of formula

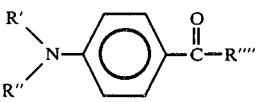

where R' and R" are alkyl of one to 4 carbon atoms and R'''' is alkyl of one to 12 carbon atoms, alkoxy of one to 12 carbon atoms, phenyl, loweralkyliminophenylene or di(loweralkyl)aminophenylene.

18. A composition according to claim 15 in which the proton donor the proton donor of p-(dimethylamino)acetophenone; p-(dimethylamino)propiophenone; p-(dimethylamino)-butyrophenone; p-(dimethylamino)-valerophenone; p-(dimethylamino)myristylphenone; a p-(diloweralkylamino)-benzoic acid ester; 4-dimethylaminobenzophenone; 4-dimethylamino-4'-propylaminobenzophenone; or 4,4'-bis(dimethylamino)-benzophenone.

19. A composition according to claim 1 in which the halogen of said halogenated diamide of a dicarboxylic acid is located alpha- to a carbonyl group.

20. A composition according to claim 1 in which two halogen atoms of said halogenated diamide of a dicarboxylic acid are located alpha- to a carbonyl group.

21. A composition according to claim 1 in which the halogenated diamine of a dicarboxylic acid is a diamide of malonic, succinic, or glutaric acid containing at least one alpha-halogen selected from Cl, Br, and I.

22. A composition according to claim 7 in which the proton donor of component D is a compound of formula

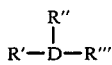

where
D is N, As or P R' and R", each independently is hydrogen, linear or branched alkyl of from 1 to about 12 carbon atoms, linear or branched alkenyl or from 2 to about 12 carbon atoms, cycloalkyl of from 3 to about 10 ring carbon atoms, cycloalkenyl of from 3 to about 10 ring carbon atoms, aryl of from 6 to 12 ring carbon atoms, alkaryl of from 6 to about 12 ring carbon atoms, aralkyl of from 6 to 12 ring carbon atoms, R''' has the same meaning as R' and R" except that it cannot be hydrogen and cannot be aryl when both R' and R" are aryl; the aryl groups can be unsubstituted or substituted by one or more of amino, mono- or di-(lower alkyl)amino, loweralkylcarbonyl, loweralkoxycarbonyl, loweralkylcarbonyloxy, phenylcarbonyl or aminophenylenecarbonyl where the amino group is unsubstituted or substituted by lower alkyl,
or where R' and R''' together with D form a heterocycle and in such case R" and R''' together are divalent alkylene of 2 to 12 carbon atoms, divalent alkenylene of 3 to 12 carbon atoms, divalent alkatrienylene of from 5 to 10 carbon atoms, divalent alkyleneoxyalkylene having a total of from 4 to 12 carbon atoms or divalent alkyleneaminoalkylene having a total of from 4 to 12 carbon atoms.

23. A composition according to claim 22 in which
a. the component A which is capable of curing, crosslinking or polymerizing is an acrylyl or methacrylyl compound,
b. the photoinitiator as the component B is an aromatic carbonyl compound,
c. the fluoran compound as the component C is as defined,
d. the proton donor of component D is a p-aminophenyl carbonyl of formula

where R' and R" are alkyl of one to 4 carbon atoms and R'''' is alkyl of one to 12 carbon atoms, alkoxy of one to 12 carbon atoms, phenyl, loweralkyliminophenylene or di(loweralkyl)aminophenylene.

24. A composition according to claim 9 in which
a. the component A capable of curing, crosslinking or polymerizing is an acrylyl or methacrylyl compound,
b. the photoinitiator as the component B is a benzoin ether, benzophenone, an alkylamino benzophenone, a monoaryl ketone, a xanthone, a thioxanthone or a quinone,
c. the fluoran compound as the component C is as defined,
d. the proton donor of component D is a p-aminophenyl carbonyl of formula

where R' and R' are alkyl of one to 4 carbon atoms and R'''' is alkyl of one to 12 carbon atoms, alkoxy of one to 12 carbon atoms, phenyl, loweralkyliminophenylene or di(loweralkyl)aminophenylene.

25. A composition according to claim 11 which comprises:
a. an acrylyl or methacrylyl compound as the component A,
b. a benzoin ether, benzophenone, an alkylamino benzophenone, a monoaryl ketone, a xanthone, a thioxanthone or a quinone as the component B,
c. a fluoran compound as defined as the component C,
d. a latent activator as the component D comprising:
(i) a p-aminophenyl carbonyl of formula:

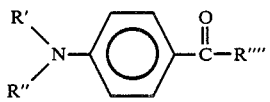

where R' and R" are alkyl of one to 4 carbon atoms and R'''' is alkyl of one to 12 carbon atoms, alkoxy of one to 12 carbon atoms, pheny, loweralkyliminophenylene or di(loweralkyl)-aminophenylene, and
(ii) a halogenated diamide of malonic, succinic or glutaric acid containing at least one alphahalogen atom selected from Cl, Br and I as the halogenated diamide of a dicarboxylic acid.

26. A composition according to claim 15 which comprises:
a. an acrylyl or methacrylyl compound as the component A,
b. a benzoin ether, benzophenone, an alkylamino benzophenone, a monoaryl ketone, a xanthone, a thioxanthone or a quinone as the component B,
c. a fluoran compound as the component C as defined,
d. a latent activator as the component D comprising
(i) a photon donor comprising a p-aminophenyl carbonyl of formula

Where R' and R" are alkyl of one to 4 carbon atoms and R'''' is alkyl of one to 12 carbon atoms, alkoxy of one to 12 carbon atoms, phenyl, loweralkyliminophenylene or di(loweralkyl)aminophenylene, and
(ii) a halogenated diamide of malonic, succinic or glutaric acid containing at least one alphahalogen selected from Cl, Br and I as the halogenated diamide of a dicarboxylic acid.

27. A composition according to claim 1 which comprises:

40 to 70 percent by weight of a preformed polymer binder;

30 to 50 percent by weight of curable crosslinkable or polymerizable compound selected from acrylyl and methacrylyl compounds and mixtures thereof as the component A;

1 to 10 percent by weight of photoinitiator selected from benzoin ethers, benzophenone, alkylaminobenzophenones, monoaryl ketones, xanthones, thioxanthones, quinones and mixtures thereof as the component B;

0.01 to 2 percent by weight of fluoran compound as the component C;

0.1 to 5 percent by weight of a halogenated diamide amide of malonic, succinic or glutaric acid containing at least one alpha-halogen selected from Cl, Br and I as the halogenated diamide of a dicarboxylic acid of component D, and 0.1 to 10 percent by weight of a tertiary amine as the proton donor of component D.

28. A composition according to claim 27 in the form of an assembly comprising a support sheet, photosensitive composition, one surface of which is adhered to the support sheet, and a transparent sheet adhered to the other surface of the photosensitive composition.

29. A composition according to claim 27 in the form of a thin layer on a support.

30. An article according to claim 29 in which the support is a conductive metal layer.

31. An article according to claim 29 in which the support is non-conductive.

32. A composition according to claim 22 which comprises:

15 to 70 percent by weight of an ethylenically unsaturated component capable of curing, crosslinking, or polymerizing under the influence of free radicals as the component A;

10 to 50 percent by weight of a preformed polymeric binder or of a compound capable of curing, crosslinking or polymerizing with said ethylenically unsaturated component under the influence of free radicals;

0.1 to 10 percent by weight of a photoinitiator as the component B;

0.01 to 2 percent by weight of fluoran compound as the component C;

0.1 to 10 percent by weight of a tertiary amine as the proton donor of the component D, and 0.1 to 5 percent by weight of a halogenated diamide of malonic, succinic or glutaric acid containing at least one alpha-halogen selected from Cl, Br and I as the halogenated diamide of a dicarboxylic acid of the component D.

33. A composition according to claim 22 which comprises:

15 to 70 percent by weight of an ethylenically unsaturated component capable of curing, crosslinking or polymerizing under the influence of free radicals as the component A;

10 to 50 percent by weight of preformed polymeric binder or of a compound capable of curing, crosslinking or polymerizing with said ethylenically unsaturated component under the influence of free radicals;

0.1 to 10 percent by weight of the photoinitiator as the component B;

0.01 to 2 percent by weight of fluoran the compound as the component C;

0.1 to 5 percent by weight of a halogenated diamide of malonic, succinic or glutaric acid containing at least one alpha-halogen selected from Cl, Br and I as the halogenated diamide of a dicarboxylic acid of component D;

0.1 to 10 percent by weight of a tertiary amine as the proton donor of component D.

34. A composition according to claim 33 which comprises:

15 to 70 percent by weight of an acrylyl or methacrylyl compound as the component A;

10 to 50 percent by weight of a preformed polymeric binder or of a compound capable of curing, crosslinking or polymerizing with said acrylyl or methacrylyl compound under the influence of free radicals;

0.1 to 10 percent by weight of an aryl carbonyl compound as the photoinitiator as the component B;

0.1 to 2 percent by weight of fluoran compound as the component C;

0.1 to 5 percent by weight of a halogenated diamide of malonic, succinic or glutaric acid containing at least one alpha-halogen selected from Cl, Br and I as the halogenated diamide of a dicarboxylic acid;

0.1 to 10 percent by weight of a p-aminophenyl carbonyl compound as the proton donor of component D.

35. A composition according to claim 34 in which the photoinitiator is a benzoin ether, benzophenone, an alkylaminobenzophenone, a monoaryl ketone, a xanthone, a thioxanthone or a quinone, and the p-aminophenyl carbonyl compound has the formula:

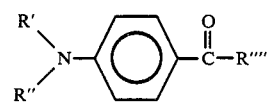

where R' and R" are alkyl of one to 4 carbon atoms and R"" is alkyl of one to 12 carbon atoms, alkoxy of one to 12 carbon atoms, phenyl, loweralkyliminophenylene or di(lower alkyl)aminophenylene.

36. A process which comprises applying the composition of claim 22 to a substrate and thereafter imagewise exposing said composition to actinic radiation.

37. A process which comprises applying the composition of claim 33 to a substrate and thereafter imagewise exposing said composition to actinic radiation.

38. A phototropic photosensitive composition which comprises:

A. at least one compound which contains at least one polymerizable ethylenically unsaturated group of the structure

capable of curing, cross linking or polymerizing under the influence of free radicals, B. a free radical producing photo initiator for said compound that is potentiated by actinic radiation, C. a colorformer capable of becoming more intensely colored upon contact with a color activator, said colorformer comprising the free base of a dyestuff whose halide salt is more intensely colored than the free base, and D. at latent activator, present in an effective amount to activate the colorformer under the influence of actinic radiation comprising a proton donor and a halogenated diamide of a dicarboxylic acid. in which the said halogenated diamide of a dicarboxylic acid has the formula:

$$R_{aa'}-\overset{O}{\overset{\|}{C}}-R_{bb'}-\overset{O}{\overset{\|}{C}}-R_{cc'}$$

where $R_{aa'}$ is amino that is unsubstituted or substituted by one or two of lower alkyl or halogenated lower alkyl; $R_{bb'}$ is a covalent bond, alkylene or haloalkylene of one to 4 carbon atoms or the group $$A-\overset{O}{\overset{\|}{C}}-B-$$

where A and b each independently is alkylene or haloalkylene of one to 4 carbon atoms; and $R_{cc'}$ is amino that is unsubstituted or substituted by one or two of lower alkyl or halogenated lower alkyl; and wherein at least one of $R_{aa'}$, $R_{bb'}$, and $R_{cc'}$ is haogenated.

39. A composition according to claim 38 in which the compound as the component A is an acrylyl or methacrylyl compound.

40. A composition according to claim 39 in which the acrylyl or methacrylyl compound has the general formula $$\overset{M}{\underset{|}{CH_2=C}}-COOM' \text{ or } (\overset{H}{\underset{|}{CH_2=C}}-COO)_rG;$$

when the compound has the formula $$\overset{M}{\underset{|}{CH_2=C}}-COOM'$$

M is H or CH$_3$
M' is cycloalkyl of 5 to 12 carbon atoms, cycloalkenyl of 5 to 12 atoms, $$-C_pH_{2p}M'' \text{ or}$$

$$(C_qH_{2q}O)_sC_qH_{2q+1};$$

where
p is an integer from 1 to 10
q is an integer from 2 to 4
s is an integer from 0 to 4
M'' is hydrogen, hydroxyl, phenoxy, alkoxy of 1 to 8 carbon atoms;
and where the compound has the formula $$(\overset{H}{\underset{|}{CH_2=C}}-COO)_rG$$

G is a polyvalent alkylene group of formula $$-C_xH_{2x-y}-$$

in which
x is an integer from 2 to 8
y is an integer from 0 to 2
or G is a divalent ether or ester group of formula $$-(C_qH_{2q}O)_tC_qH_{2q}-$$

or $$-(C_qH_{2q}COO)_tC_qH_{2q}-$$

where
t is an integer from 1 to 5,
q is an integer from 2 to 4
and r is the valence of G and is an integer from 2 to 4.

41. A composition to claim 39 in which the acrylyl compound is triethyleneglycol diacrylate, tetraethylene glycol diacrylate, pentaerythritol triacrylate, trimethylolpropane triacrylate or pentaerythritol tetraacrylate.

42. A composition according to claim 38 in which the photoinitiator as the component B is an aromatic carbonyl compoumd.

43. A composition according to claim 38 in which the photoinitiator as the component B is a benzoin ether, benzophenone, an alkylamino benzophenone, a monoaryl ketone, a xanthone, a thioxanthone, or a quinone.

44. A composition according to claim 38 in which the proton donor of component D is a compound of the formula $$R'-\overset{R''}{\underset{|}{D}}-R'''$$

where
D is N, As or P R' and R'', each independently is hydrogen, linear or branched alkyl of from 1 to about 12 carbon atoms, linear or branched alkenyl of from 2 to about 12 carbon atoms, cycloalkyl of from 3 to about 10 ring carbon atoms, cycloalkenyl of from 3 to about 10 ring carbon atoms, aryl of from 6 to 12 ring carbon atoms, alkaryl of from 6 to about 12 ring carbon atoms, aralkyl of from 6 to 12 ring carbon atoms, R''' has the same meaning as R' and R'' except that it cannot be hydrogen and cannot be aryl when both R' and R'' are aryl; the aryl groups can be unsubstituted or substituted by one or more of amino, mono- or di-(lower alkyl)amino loweralkylcarbonyl, loweralkoxycarbonyl, loweralkylcarbonyloxy, phenylcarbonyl or aminophenylenecarbonyl where the amino group is unsubstituted or substituted by lower alkyl,
or where R' and R''' together with D form a heterocycle and in such case R'' and R''' together are divalent alkylene of 2 to 12 carbon atoms, divalent alkenylene of 3 to 12 carbon atoms, divalent alkatrienylene of from 5 to 10 carbon atoms, divalent alkyleneoxyalkylene having a total of from 4 to 12 carbon atoms or divalent alkyleneaminoalkylene having a total of from 4 to 12 carbon atoms.

45. A composition according to claim 44 where D is nitrogen.

46. A composition according to claim 44 in which the proton donor of component D is a p-aminophenyl carbonyl of formula

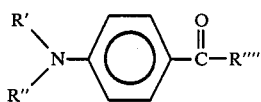

where R' and R" are alkyl of one to 4 carbon atoms and R"" is alkyl of one to 12 carbon atoms, alkoxy of one to 12 carbon atoms, phenyl, loweralkyliminophenylene or di(loweralkyl)aminophenylene.

47. A composition according to claim 44 in which the proton donor of component D is p-(dimethylamino)acetophenone; p-(dimethylamino)propiophenone; p-(dimethylamino)-butyrophenone; p-(dimethylamino)-valerophenone; p-(dimethylamino)myristylphenone; a p-(diloweralkylamino)-benzoic acid ester; 4-dimethylaminobenzophenone; 4-dimethylamino-4'-propylaminobenzophenone; or 4,4'-bis(dimethylamino)-benzophenone.

48. A composition according to claim 38 in which the halogen of said halogenated diamide of a dicarboxylic acid is located alpha- to a carbonyl group.

49. A composition according to claim 38 in which two halogen atoms of said halogenated diamide of a dicarboxylic acid are located alpha- to a carbonyl group.

50. A composition according to claim 38 in which the halogenated diamide of a dicarboxylic acid is a diamide of malonic, succinic, or glutaric acid containing at least one alpha-halogen selected from Cl, Br, and I.

51. A composition according to claim 38 which comprises:
   40 to 70 percent by weight of a preformed polymer binder;
   30 to 50 percent by weight of curable crosslinkable or polymerizable component selected from acrylyl and methacrylyl compounds and mixtures thereof as the component A;
   1 to 10 percent by weight of photoinitiator selected from benzoin ethers, benzophenone, alkylaminobenzophenones, monoaryl ketones, xanthones, thioxanthones, quinones and mixtures thereof as the component B;
   0.01 to 2 percent by weight of fluoran compound as the component C;
   0.1 to 5 percent by weight of a halogenated diamide of malonic, succinic or glutaric acid containing at least one alpha-halogen selected from Cl, Br and I as the halogenated diamide of a dicarboxylic acid of component D, and
   0.1 to 10 percent by weight of a tertiary amine as the proton donor of component D.

52. A composition according to claim 51 in the form of an assembly comprising a support sheet, photosensitive composition, one surface of which is adhered to the support sheet, and a transparent sheet adhered to the other surface of the photosensitive composition.

53. A composition according to claim 51 in the form of a thin layer on a support.

54. An article according to claim 53 in which the support is a conductive metal layer.

55. An article according to claim 53 in which the support is non-conductive.

56. A composition according to claim 38 in which the colorformer as the component C is the free base of a ketone imine, an amino triarylmethane, an amino xanthene, an amino acridine or a methine or polymethine dyestuff.

57. A composition according to claim 56 in which the colorformer is the free base of an amino triarylmethane dyestuff.

58. A composition according to claim 56 in which the colorformer is the free base of an amino xanthene dyestuff.

59. A composition according to claim 56 in which the colorformer is the free base of an amino acridine dyestuff.

60. A composition according to claim 56 in which the colorformer is a methine or polymethine dyestuff.

61. A composition according to claim 56 in which the colorformer is the free base of a Ketone-imine dyestuff.

62. A composition according to claim 27 in the form of a thin layer.

63. A composition according to claim 51 in the form of a thin layer.

* * * * *

UNITED STATES PATENT AND TRADEMARK OFFICE
CERTIFICATE OF CORRECTION

PATENT NO. : 4,552,830
DATED : Nov. 12, 1985
INVENTOR(S) : Edward J. Reardon and Melvin A. Lipson It is certified that error appears in the above-identified patent and that said Letters Patent is hereby corrected as shown below:

Column 6, line 39, change "oneh" to -one-.

Column 8, line 67, change "-G-" to -6-.

Column 11, line 20, at the upper right of bracket insert -+-.

Column 19, line 32, formula should read:

Column 22, line 6, formula should read:

Column 24, line 1, change "carboxylic" to -carbocyclic-.

Column 24, line 35, change "compounds" to -components-.

Column 33, 6th line from bottom, change "H-N-$CH_3$" to -H-S-$CH_3$-.

Column 37, line 22, change "dimethylethylanolamine" to -dimethylethanolamine-.

Column 38, line 5, change "second" to -seconds-.

Column 41, Claim 3, last line in column, delete "ti".

Column 42, Claim 3, line 5 of column, change "or" to -of-.

UNITED STATES PATENT AND TRADEMARK OFFICE
CERTIFICATE OF CORRECTION

PATENT NO. : 4,552,830

DATED : Nov. 12, 1985

INVENTOR(S) : Edward J. Reardon and Melvin A. Lipson

It is certified that error appears in the above-identified patent and that said Letters Patent is hereby corrected as shown below:

Column 45, Claim 14, line 54 of column, at the upper right of formula, change "$R'_4$" to $-R_4-$.

Column 48, Claim 26, line 1 of claim, change "15" to -13-.

Column 49, Claim 27, line 15 of column, delete "amide".

Column 50, Claim 34, line 19 "0.1" should be --0.01--

Column 51, Claim 38, line 27-28 of column, change "haogenated" to -halogenated-.

Signed and Sealed this

Eighth Day of October, 1991

Attest:

HARRY F. MANBECK, JR.

*Attesting Officer*  *Commissioner of Patents and Trademarks*